(12) United States Patent
Pitzak et al.

(10) Patent No.: US 11,906,250 B2
(45) Date of Patent: Feb. 20, 2024

(54) CARBON FIBER RADIATOR FIN SYSTEM

(71) Applicant: Atomos Nuclear and Space Corporation, Denver, CO (US)

(72) Inventors: Sandra Pitzak, Boulder, CO (US); Vanessa Jane Clark, Denver, CO (US)

(73) Assignee: Atomos Nuclear and Space Corporation, Denver, CO (US)

( * ) Notice: Subject to any disclaimer, the term of this patent is extended or adjusted under 35 U.S.C. 154(b) by 102 days.

(21) Appl. No.: 17/740,238

(22) Filed: May 9, 2022

(65) Prior Publication Data

US 2022/0268531 A1    Aug. 25, 2022

Related U.S. Application Data

(63) Continuation of application No. 16/664,986, filed on Oct. 28, 2019, now Pat. No. 11,326,841.

(60) Provisional application No. 62/754,325, filed on Nov. 1, 2018.

(51) Int. Cl.
  *F28F 1/30*   (2006.01)
  *F28F 21/02*  (2006.01)
  *B23K 15/00*  (2006.01)

(52) U.S. Cl.
  CPC ............ *F28F 1/30* (2013.01); *B23K 15/0046* (2013.01); *F28F 21/02* (2013.01)

(58) Field of Classification Search
  CPC .......... F28F 1/30; F28F 21/02; B25K 15/0046
  USPC ........................................................ 165/181
  See application file for complete search history.

(56) References Cited

U.S. PATENT DOCUMENTS

| | | | |
|---|---|---|---|
| 5,358,032 A * | 10/1994 | Arai ........................ | F28F 3/022 174/16.3 |
| 10,001,256 B2 * | 6/2018 | Cai ........................ | F21V 3/0625 |
| 2005/0167083 A1 * | 8/2005 | Belady ................. | H01L 23/427 257/E23.099 |

* cited by examiner

*Primary Examiner* — Joel M Attey
(74) *Attorney, Agent, or Firm* — Neugeboren O'Dowd PC

(57) ABSTRACT

Systems and methods of manufacture of radiator fins. In one embodiment, a radiator fin made of carbon fiber is provided. In one aspect, the radiator fin is made of carbon fibers forming an interlaced pattern. In another aspect, the interlaced carbon fiber radiator fin is attached directly to a heat pipe, the heat pipe connected to a heat source.

12 Claims, 18 Drawing Sheets

CARBON FIBER RADIATOR FIN SYSTEM

CROSS-REFERENCE TO RELATED APPLICATION

This application is a continuation of U.S. patent application Ser. No. 16/664,986, filed Oct. 28, 2019 and titled "Carbon Fiber Radiator Fin System," which application is a nonprovisional patent application of and claims the benefit of U.S. Provisional Patent Application No. 62/754,325, filed Nov. 1, 2018 and titled "Carbon Fiber Radiator Fin System," the disclosure of which are hereby incorporated herein by reference in their entirety.

FIELD

The disclosure relates generally to systems and methods of manufacture of radiator fins, and more specifically to systems and methods of manufacture of carbon fiber radiator fins such as carbon fiber radiator fins for space applications.

BACKGROUND

Radiators are heat exchangers which transfer thermal energy from one medium to another to provide cooling or heating. A radiator device rejects heat by radiating heat energy from surface components, commonly planar surfaces to provide maximum surface area for the heat radiation. Radiator design reflects many requirements, to include the amount of thermal energy involved, type of thermal transfer means, and weight or size limitations.

The design requirements for radiators used in space are particularly challenging and problematic, given the severe constraints placed on weight and size of any device or component launched into space. Space radiators radiate heat energy away from radiator fins by radiating light energy, e.g. infrared light energy, away from the surface of the radiator fins. For space applications that require a particularly large amount of heat rejection, radiator fins must be conductive and heat tolerant, while maximizing heat radiated per unit area and per unit mass.

Traditional radiators used in space applications consist of flat metal panels with a working fluid transporting heat to the panels from the spacecraft via heat pipes; the panels radiate this heat into space. For applications where a relatively large amount of heat must be removed, but mass and area are particularly limited, such as in nuclear-electric propulsion spacecraft, the radiators operate at higher temperatures in order to reduce the required radiator area. A conventional design for space radiators uses an enclosed panel, which presents inefficiencies in thermal transfer and thermal radiation efficiencies.

The disclosure addresses the conventional challenges and problems of space radiators by providing a carbon fiber radiator system comprising radiator fins formed from interlaced carbon fibers, wherein the radiator fins are attached directly to a heat pipe connected to the heat source. Although the disclosure focuses on the use of interlaced carbon fibers to form a radiator fin, other materials may be used to form the radiator fins disclosed, to include any material that may be formed into strands, yarn, or ribbon with the flexibility to form the various shapes and patterns disclosed.

SUMMARY

The present disclosure can provide several advantages depending on the particular aspect, embodiment, and/or configuration.

Generally, a carbon fiber radiator system comprising one or more radiator fins formed from interlaced carbon fibers is disclosed. The radiator fins are attached directly to a heat pipe connected to the heat source. A greater percentage of the individual carbon fibers creating the radiator fin form a direct thermal interconnection with the heat pipe; in one embodiment, substantially all of the carbon fibers form a direct thermal interconnection with the heat pipe.

Carbon-fiber has a high temperature tolerance, high thermal conductivity, and low density, making it a desirable material for radiator fins. In one embodiment, the heat source is associated with a nuclear-electric propulsion system. One or more methods, techniques, and designs from the textile industry are used to form the interlaced carbon fibers of the radiator fins. For example, knitting and weaving are used to form interlaced carbon fibers into a substantially planar radiator fin.

In one embodiment, a carbon fiber radiator fin system is disclosed, the system comprising: a set of carbon fibers configured to bend at least along a longitudinal axis, each carbon fiber configured to conduct thermal energy when in thermal communication with a heat pipe; wherein: the set of carbon fibers form an interlaced pattern and define a radiator fin, the radiator fin in thermal communication with the heat pipe, substantially each carbon fiber of the set of carbon fibers in direct thermal contact with the heat pipe; the interlaced pattern is at least one of a braided pattern and a knit stitch pattern; and the radiator fin conducts thermal energy away from the heat pipe.

In one aspect, the interlaced pattern is a braided interlaced pattern. In another aspect, the braided interlaced pattern is devoid of weft tows. In another aspect, the interlaced pattern defines a carbon fiber mat with a longitudinal axis extending with an axial length of the set of carbon fibers, the heat pipe substantially parallel with the carbon fiber mat longitudinal axis. In another aspect, substantially each carbon fiber of the carbon fiber mat is coupled to the heat pipe at more than one location along a respective longitudinal axis of each carbon fiber. In another aspect, at least a portion of the radiator fin at least partially encircles the heat pipe. In another aspect, the radiator fin is attached to the heat pipe by electron beam welding. In another aspect, the radiator fin comprises a substantially straight edge. In another aspect, the heat pipe is in thermal communication with a thermal energy source. In another aspect, the thermal energy source is a nuclear-electric propulsion system. In another aspect, the surface of the radiator fin is an uneven surface. In another aspect, substantially each carbon fiber of the set of carbon fibers are coupled to the heat pipe at more than one location along a respective longitudinal axis of each carbon fiber.

In another embodiment, a method of manufacturing a carbon fiber radiator fin system is disclosed, the method comprising: providing a set of carbon fibers configured to bend at least along a longitudinal axis; interlacing the set of carbon fibers to form a radiator fin, the radiator fin formed from the set of carbon fibers; and attaching the radiator fin to a heat pipe, the heat pipe in thermal communication with a thermal energy source; wherein: substantially each carbon fiber of the set of carbon fibers is coupled to the heat pipe; and the radiator fin conducts thermal energy away from the heat pipe.

In one aspect, the radiator fin is devoid of weft tows in the subset of carbon fibers. In another aspect, the surface of the radiator fin is a textured surface. In another aspect, the interlaced pattern is at least one of a braided pattern and a knit stitch pattern. In another aspect, the attaching the radiator fin to a heat pipe step is performed by electron beam welding. In another aspect, the interlaced pattern is a knit stitch interlaced pattern which defines a carbon fiber mat with a longitudinal axis extending with an axial length of the set of carbon fibers, the heat pipe substantially parallel with the carbon fiber mat longitudinal axis. In another aspect, the heat pipe is coupled to each carbon fiber at multiple locations along a respective longitudinal axis of each carbon fiber. In another aspect, the surface of the radiator fin is a textured surface and the interlaced pattern is a knit stitch interlaced pattern.

The term "basket weave" means a stitch which alternates n by m sections of knit and purl stitches, resulting in a checkerboard or basket weave appearance.

The term "braid" means a type of weaving where three or more strands cross over each other in turn to yield a product that is typically much longer than its width, such as a rope.

The term "carbon-fiber" or "carbon fiber" means fibers made mostly of carbon which have properties desirable for many high-technology applications.

The term "fin" means a thin, thermally conductive material, typically attached to a heat pipe, that radiates heat, such as into outer space.

The term "garter" means a stitch pattern consisting of alternating rows of all-knit and all-purl stitches The terms "interlaced" and "interwoven" mean crossed intricately together.

The phrase "heat pipe" means a hollow, usually metal pipe containing a working fluid used to conduct heat away from a thermal source to a radiator.

The term "knit" means 1) the process of turning a one-dimensional, continuous strand into a two-dimensional fabric, using interlocking loops called stitches; or 2) a type of stitch that is the inverse of a purl stitch.

The term "purl" means the inverse of a knit stitch, used to create a texture difference; the front of a knit stitch looks like the back of a purl stitch, and vice-versa.

The term "radiator" means a heat exchanger which transfers, radiates, disperses, and/or dissipates thermal energy such as heat from one medium to another to provide cooling or heating.

The term "rib" means a stitch pattern that alternates one or more knit stitches with one or more purl stitches, with every row the same, resulting in a ribbed appearance.

The term "row" means 1) a series of stitches that is often repeated in a desired pattern; and 2) smallest unit of length in a knit pattern.

The term "seed stitch" means a stitch pattern that alternates knit and purl stitches both horizontally and vertically, resulting in a bumpy texture.

The term "stitch" means the smallest unit of width in a knit pattern.

The term "stockinette" means a stitch pattern that consists of all knit or all purl (depending which side it is viewed from).

The term "thermal energy" means the internal energy present in a system due to its temperature The term "tow" means an untwisted bundle of continuous fibers.

The term "warp" means a set of fibers along the length of a woven fabric.

The term "weave" means a method of creating fabric by crossing fibers over and under each other that requires multiple strands in parallel and at least one that crosses the others.

The term "weft" means a set of fibers that go across a woven fabric.

The phrase "working fluid" means a fluid that transports heat by flowing through a heat pipe.

The term "yarn" means a twisted bundle of continuous fibers.

The phrases "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

The term "a" or "an" entity refers to one or more of that entity. As such, the terms "a" (or "an"), "one or more" and "at least one" can be used interchangeably herein. It is also to be noted that the terms "comprising", "including", and "having" can be used interchangeably. The term "automatic" and variations thereof, as used herein, refers to any process or operation done without material human input when the process or operation is performed. However, a process or operation can be automatic, even though performance of the process or operation uses material or immaterial human input, if the input is received before performance of the process or operation. Human input is deemed to be material if such input influences how the process or operation will be performed. Human input that consents to the performance of the process or operation is not deemed to be "material".

The terms "determine", "calculate" and "compute," and variations thereof, as used herein, are used interchangeably and include any type of methodology, process, mathematical operation or technique.

The term "means" as used herein shall be given its broadest possible interpretation in accordance with 35 U.S.C., Section 112, Paragraph 6. Accordingly, a claim incorporating the term "means" shall cover all structures, materials, or acts set forth herein, and all of the equivalents thereof. Further, the structures, materials or acts and the equivalents thereof shall include all those described in the summary, brief description of the drawings, detailed description, abstract, and claims themselves.

Various embodiments or portions of methods of manufacture may also or alternatively be implemented partially in software and/or firmware, e.g. analysis of signs. This software and/or firmware may take the form of instructions contained in or on a non-transitory computer-readable storage medium. Those instructions may then be read and executed by one or more processors to enable performance of the operations described herein. The instructions may be in any suitable form, such as but not limited to source code, compiled code, interpreted code, executable code, static code, dynamic code, and the like. Such a computer-readable medium may include any tangible non-transitory medium for storing information in a form readable by one or more computers, such as but not limited to read only memory (ROM); random access memory (RAM); magnetic disk storage media; optical storage media; a flash memory, etc.

The preceding is a simplified summary of the disclosure to provide an understanding of some aspects of the disclosure. This summary is neither an extensive nor exhaustive overview of the disclosure and its various aspects, embodiments, and/or configurations. It is intended neither to identify key or critical elements of the disclosure nor to delineate the scope of the disclosure but to present selected concepts of the disclosure in a simplified form as an introduction to the more detailed description presented below. As will be appreciated, other aspects, embodiments, and/or configurations of the disclosure are possible utilizing, alone or in combination, one or more of the features set forth above or described in detail below. Also, while the disclosure is presented in terms of exemplary embodiments, it should be appreciated that individual aspects of the disclosure can be separately claimed.

BRIEF DESCRIPTION OF THE DRAWINGS

The disclosure will be readily understood by the following detailed description in conjunction with the accompanying drawings, wherein like reference numerals designate like elements. The elements of the drawings are not necessarily to scale relative to each other. Identical reference numerals have been used, where possible, to designate identical features that are common to the figures.

DETAILED DESCRIPTION

Reference will now be made in detail to representative embodiments. The following descriptions are not intended to limit the embodiments to one preferred embodiment. To the contrary, it is intended to cover alternatives, modifications, and equivalents as can be included within the spirit and scope of the described embodiments as defined, for example, by the appended claims.

The disclosed devices, systems, and methods of use will be described with reference to FIGS. 1-13.

Figure 1:
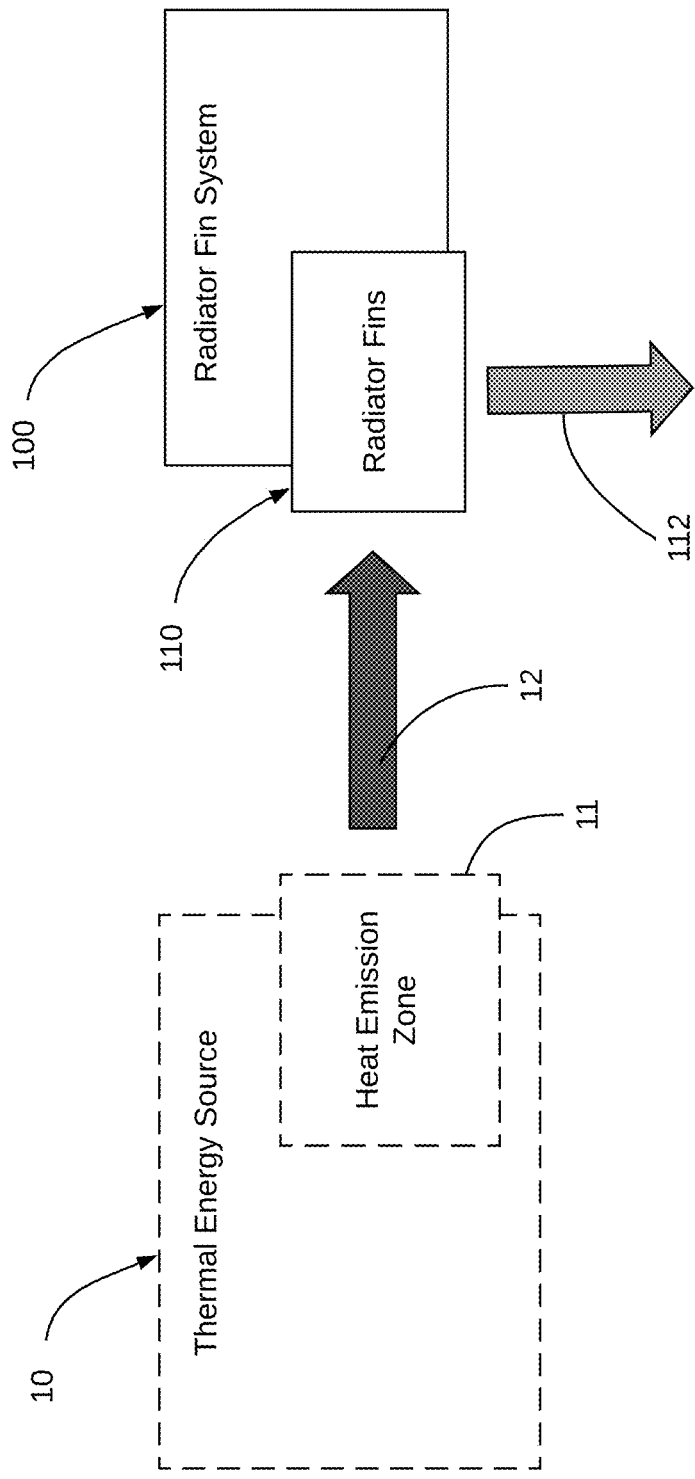
FIG. 1 is a schematic diagram of one embodiment of a radiator fin system in an operational environment.

With attention to FIG. 1, one embodiment of a radiator fin system 100 is depicted in an operational environment. The operational environment includes a thermal energy source 10, the thermal energy source comprising a heat emission zone 11. The thermal energy source 10 may be any source of device or system that produces thermal energy, such as an engine or other power system. The thermal emission zone 11 outputs thermal energy and is typically a subset or portion of the thermal energy source 10. For example, an internal combustion engine acts as a thermal energy source 10 in which exhaust gases form a heat emission zone 11.

A radiator fin system 100 is engaged, or in thermal communication with, the thermal energy source 10 to receive thermal energy from the heat emission zone 11 and to dissipate that thermal energy as thermal energy radiation 112 by way of radiator fins 110. Stated another way, the radiator fins 110 of a radiator fin system 100 receive thermal energy transfer 12 input from the heat emission zone 11 of a thermal energy source 10 and remove or output that thermal energy by way of thermal energy radiation 112.

Figure 2A:
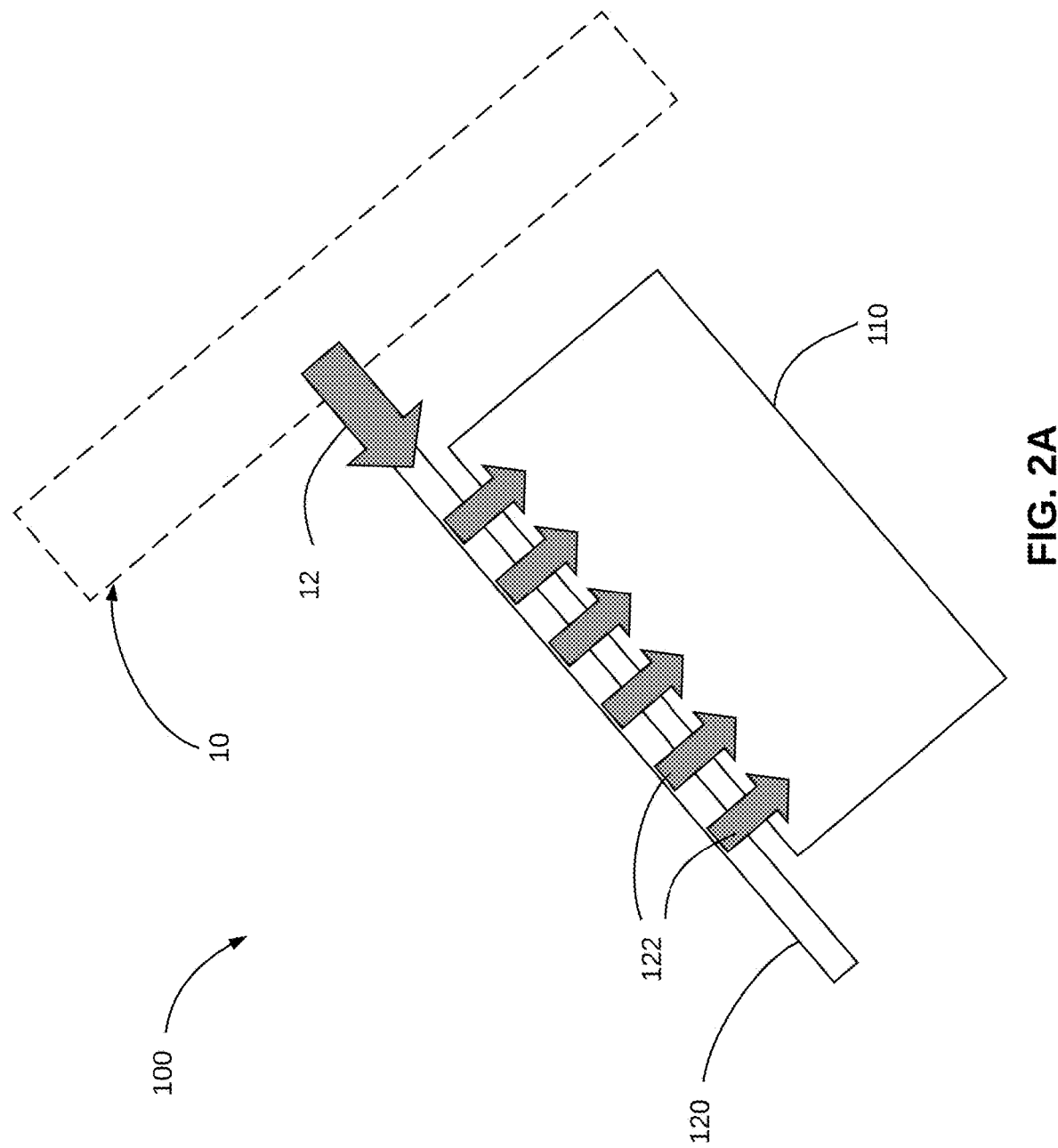
FIG. 2A is a depiction of another embodiment of a radiator fin system in an operational environment.
Figure 2B:
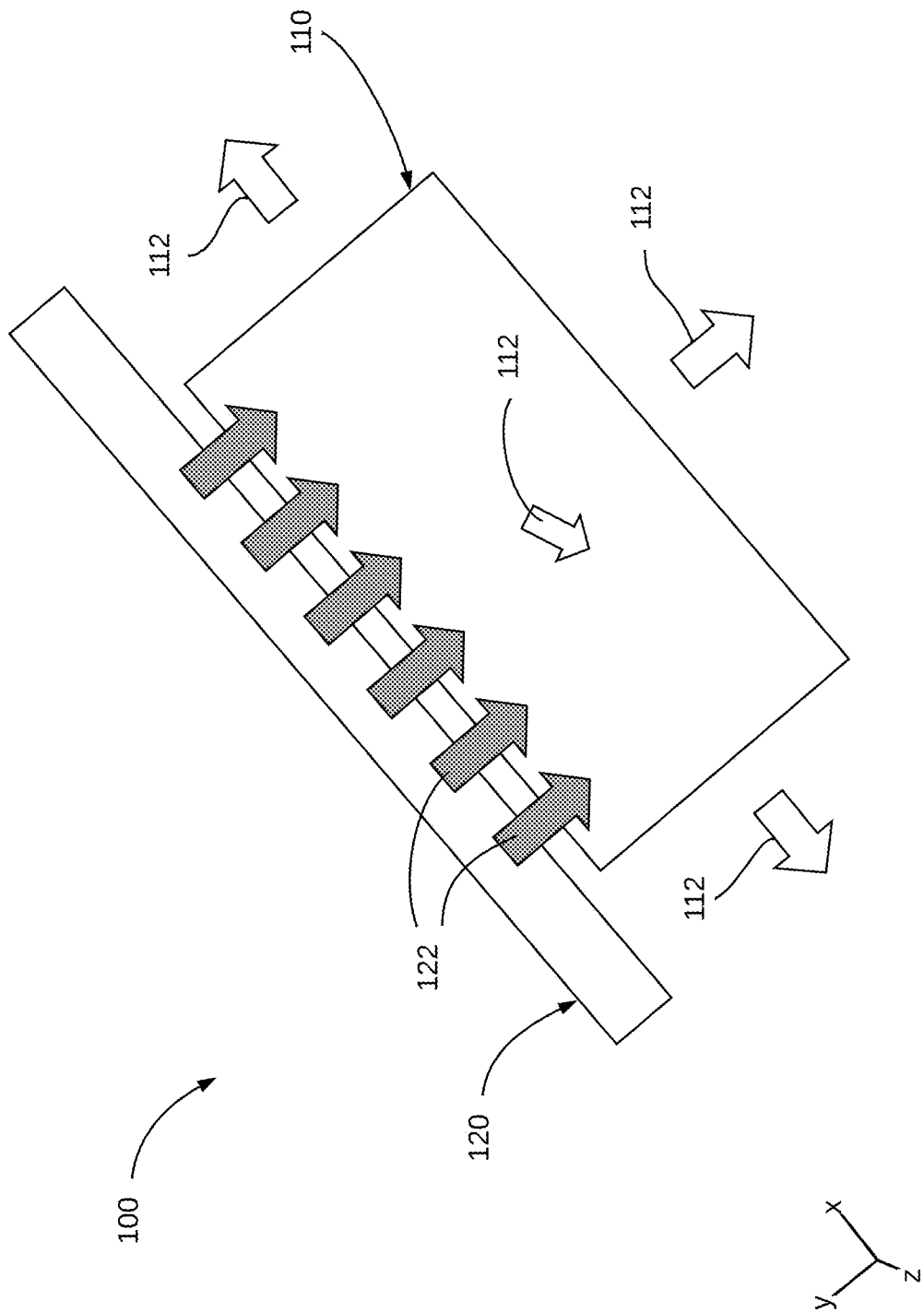
FIG. 2B is a more detailed depiction of the embodiment of a radiator fin system of FIG. 2A in an operational environment.

FIGS. 2A-B depict another embodiment of a radiator fin system 100 in an operational environment. A thermal energy source 10 is shown with thermal energy transfer 12. The thermal energy transfer 12 is received by heat pipe 120. The heat pipe 120 in turn emits or outputs heat 122 (or more generally, emits thermal energy) received by the radiator fin 110. Although the heat 122 is depicted in FIGS. 2A-B as solely in a planar orientation parallel to the radiator fin 110, the heat 122 is typically emitted in all directions surrounding the heat pipe 120. For example, if the heat pipe 120 is of cylindrical shape, the heat 122 is emitted along all radials from the centerline of the cylindrically shaped heat pipe 120. The radiator fin 110 receive the heat 122 from the heat pipe 120 and dissipates the heat, as shown as dissipated heat 112. Like the emission of heat 122 from heat pipe 120, the dissipated heat 122 emitted or discharged from the radiator fin 110 typically occurs in three-dimensions. Stated another way, the dissipated heat 112 emitted or discharged or dissipated by the radiator fin 110 occurs in a longitudinal (x), lateral (y), and/or a vertical (z) direction.

Other configurations of the heat pipe 120 are possible beyond a cylindrical pipe configuration, as known to those skilled in the art. For example, the heat pipe 120 may be curved, may comprise more than one internal aperture or cavity, and/or comprise portions that are of varied elastic properties.

Other configurations of relative orientation between the radiator fin 110 and the heat pipe 120 are possible, such as configurations in which the radiator fin 110 at least partially encircles at least a portion of the heat pipe 120, etc.

FIGS. 3-10 depict various embodiments and features of the radiator fin 110, such as the configuration of interlaced carbon fibers that form the radiator fin 110, and configurations of the radiator fin 110 relative to a heat pipe 120. In particular, various embodiments and configurations of interlaced carbon fiber radiator fins 110 are described, such as braided and knit interlaced carbon fiber radiator fins 110.

A description of some aspects of carbon fiber for use in radiator fin applications is provided by Briana N. Tomboulin, *Lightweight, High-Temperature Radiator for In-Space Nuclear-Electric Power and Propulsion* (2014), draft Doctoral Dissertation, May 2014—current ("Tomboulin") incorporated by reference in entirety for all purposes. Tomboulin provides that weft tows are required to keep warp tows in order, and that the number of weft tows should be minimized because weft tows do not contribute to heat rejection from a radiator fin. In contrast, the disclosure describes radiator fins with interlaced carbon fibers that eliminate weft tows entirely, such as provided in braided interlaced carbon fiber radiator fin 110 embodiments and in knit interlaced carbon fiber radiator fin 110 embodiments. Stated another way, in some embodiments, one or more radiator fins are comprised of a set of interlaced carbon fibers, the set of interlaced carbon fibers devoid of weft tows.

A description of types of interlaced patterns such as employed in knitting may be found any of several references known to those skilled in the art. Yordan Kyosev, *Advances in Braiding Technology: Specialized Techniques and Applications*, Vol. Number 177. Cambridge, Amsterdam: Woodhead Publishing, 2016, provides additional background on three-dimensional braided patterns, and is incorporated by reference in entirety for all purposes. Note that although specific examples of interlocking patterns are described in the disclosure, other types of interlocking patterns are possible, such as any interlocking pattern known to those skilled in the art. Also, although specific orientations of certain interlocking patterns with respect to heat pipes are disclosed, other orientations are possible with respect to other interlocking patterns; more specifically, other orientations in which maximum contact points between fibers of a particular interlocking pattern and a heat pipe are possible.

Figure 3:
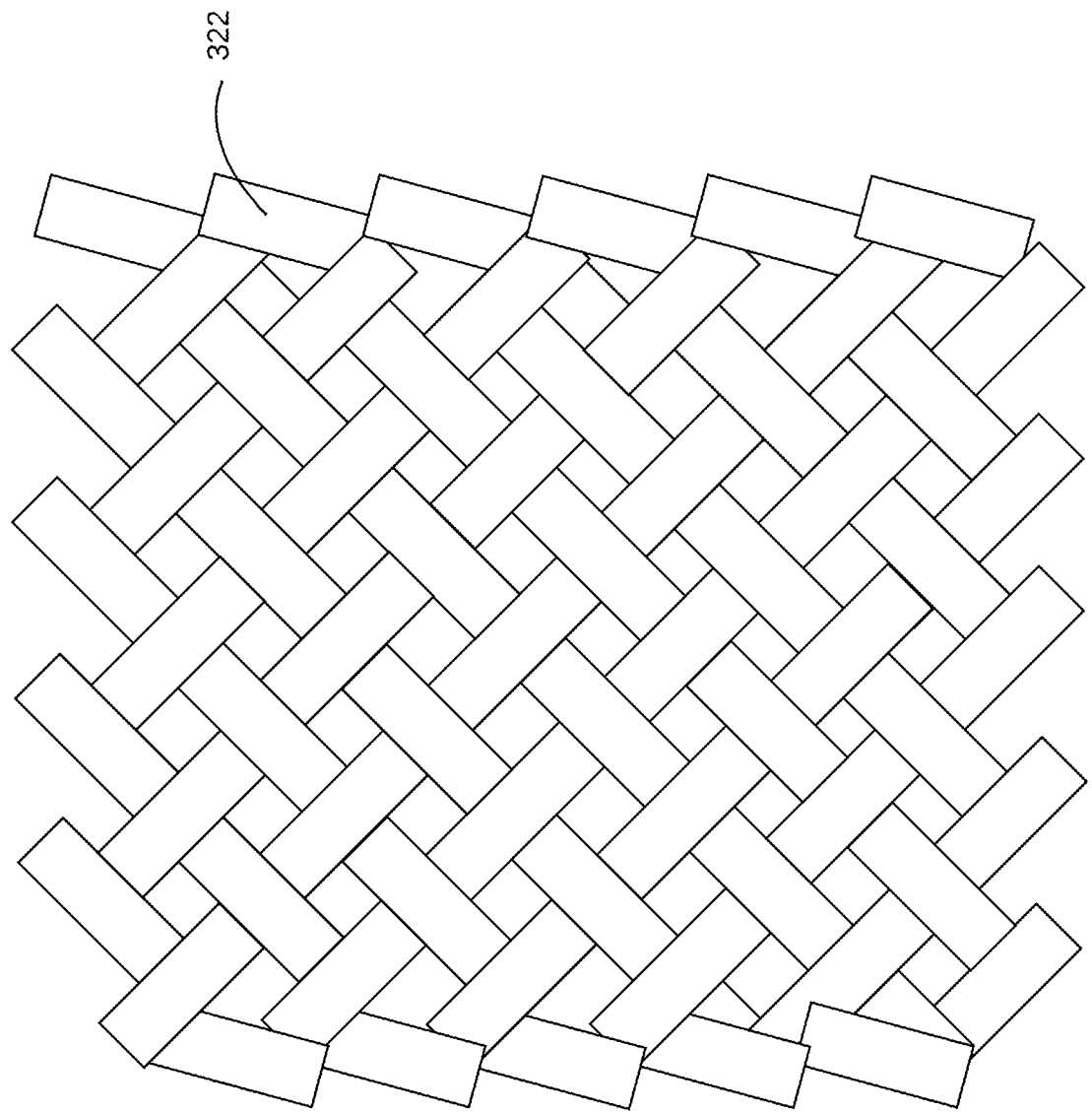
FIG. 3 is a depiction of one embodiment of interconnected carbon fibers formed in a braid pattern.

With attention to FIG. 3, one embodiment of interconnected carbon fibers formed in a braid pattern to create a carbon fiber mat 320 is depicted. The carbon fiber mat 320 comprises a plurality of carbon fibers 322. More specifically, the carbon fibers 322 form the carbon fiber mat 320 by crossing n carbon fibers 322 back and forth over one other in an ordered pattern, where n is greater than or equal to three. Note that braids may have as many fibers as the weaver (or weaving machine) may handle and are typically either two-dimensional (flat) or three-dimensional (round, square, or more complex cross-sections). The braid pattern of FIG. 3 is a typical flat braid. Other configurations of braid are possible, to include, e.g., a three-dimensional braid pattern in which individual carbon fiber strands wrap around along a radial or longitudinal axis, not unlike braids woven in human hair. The dimensions of the braid (e.g. length, width, number of strands), the thickness of the strand, and tightness of the weave may vary, as known to those skilled in the art. Among other things, the advantages of a braided fabric include the absence of any relatively tight bends of the woven fibers, and the ability to present multiple points of contact with a heat source (as described below).

The orientation and configuration of the carbon fibers relative to the heat pipe effects the efficiency of the radiator fin formed from the carbon fiber mat. Generally, an increase in contact points between the carbon fibers and the heat pipe causes an increase in thermal dissipation efficiency, meaning more heat will be discharged by the radiator fin.

Figure 4A:
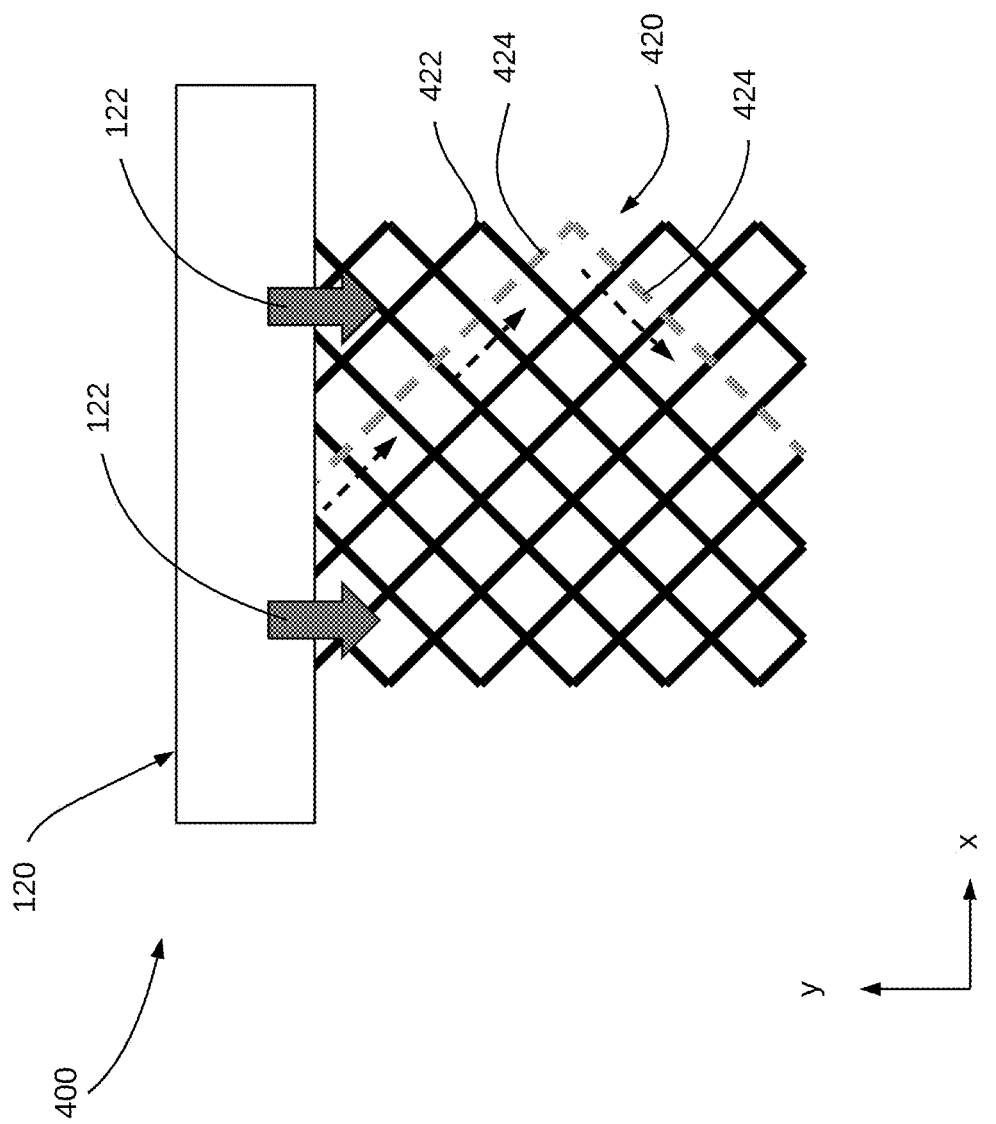
FIG. 4A is a depiction of one embodiment of a radiator fin system using the embodiment of interconnected carbon fibers formed in the braid pattern of FIG. 3.
Figure 4B:
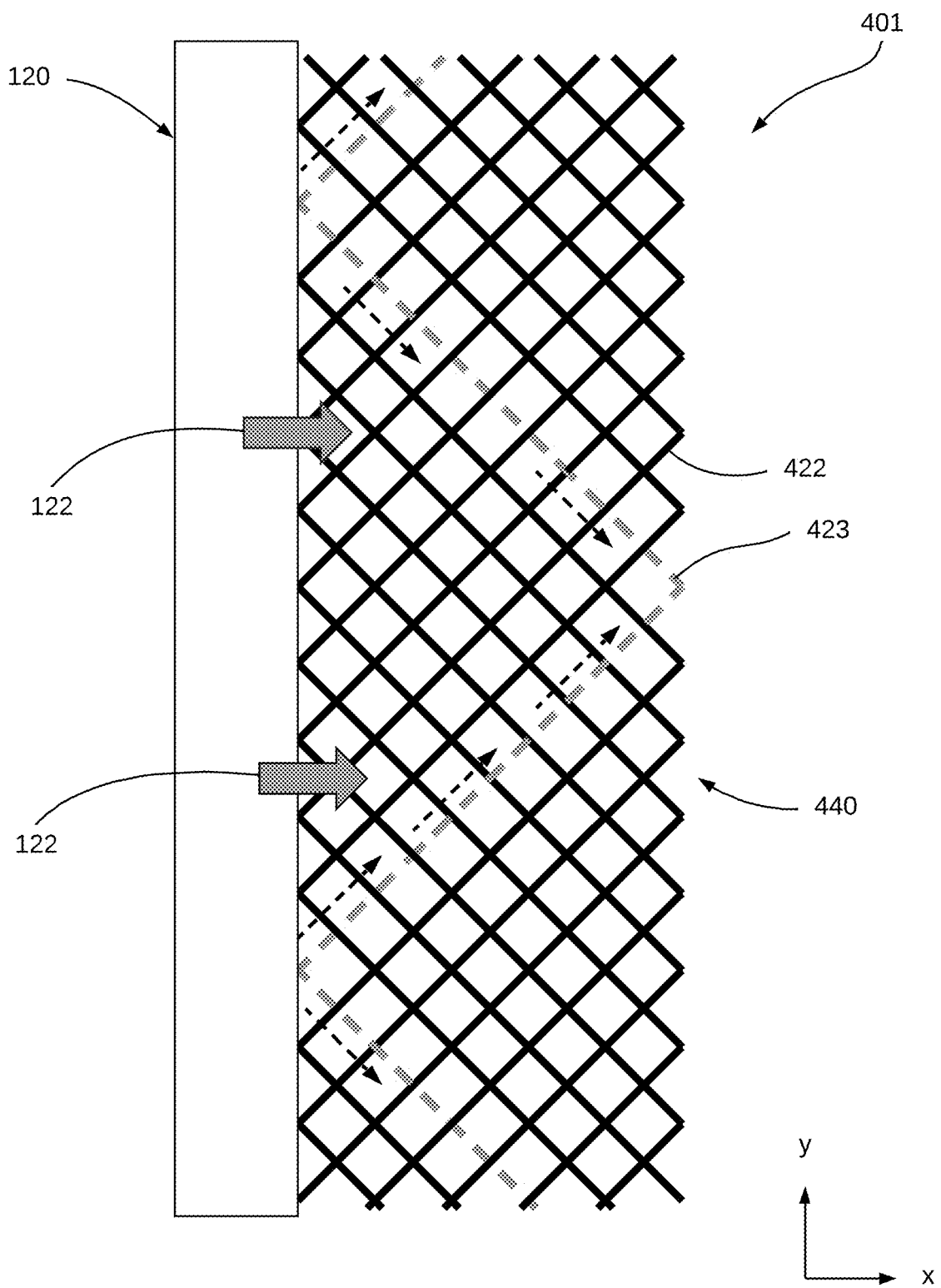
FIG. 4B is a depiction of another embodiment of a radiator fin system using the embodiment of interconnected carbon fibers formed in the braid pattern of FIG. 3.

FIGS. 4A-B depict two embodiments of a radiator fin system 400, 401 respectively, each comprising a radiator fin comprising a carbon fiber mat 420, 440 generally similar to that of the carbon fiber mat 320 of FIG. 3. Specifically, each of the carbon fiber mats 420 and 440 are formed from a plurality of interconnected carbon fibers 422 formed in a braid pattern to create a carbon fiber mat 420, 440. FIG. 4A and FIG. 4B differ in the orientation of the carbon fiber mat 420, 440 relative to the heat pipe 120. Specifically, FIGS. 4A and 4B differ in that FIG. 4A depicts a generally two-dimensional (flat) carbon fiber mat 420 oriented such that the general running length, i.e. longitudinal axis, of the carbon fibers run perpendicular or away from the heat pipe. In contrast, FIG. 4B depicts a generally two-dimensional (flat) carbon fiber mat 440 oriented such that the general running length, i.e. longitudinal axis, of the carbon fibers run parallel or with the heat pipe. In each of the carbon fiber mat 420 of FIG. 4A and the carbon fiber mat 440 of FIG. 4B, a set or plurality of carbon fibers 422 are braided with one another along the axial length of the carbon fibers 422, forming a length of carbon fiber mat 420 extending in they axis direction of FIGS. 4A-B.

With attention to FIG. 4A, a carbon fiber mat 420 is shown in thermal communication with a heat pipe 120, the heat pipe 120 emitting heat 122 toward the carbon fiber mat 420. The carbon fiber mat 420 forms a radiator fin system 400. The individual carbon fibers 422 of the carbon fiber mat 420 are oriented to generally run or extend perpendicular to the axis of the heat pipe 120, as depicted by example carbon fiber 424 shown as a dashed line. Stated another way, the braid pattern formed by the individual carbon fibers 422 generally runs away from or extends away from the heat pipe 120. With reference to the x-y axis of FIG. 4A, the end of each carbon fiber strand 422 forming a braid with other carbon fibers 422 generally runs in the y direction and the heat pipe 120 is oriented with axial length in the x direction. Here, the y axis is along the longitudinal length of the carbon mat and the x axis is along the lateral width of the carbon mat. In such a configuration, each end of a carbon fiber 422 forms a thermal connection (if not also a physical connection) with the heat pipe 120, such that heat 122 emitted from the heat pipe 120 flows or is received along the directions shown by the dashed arrows. Note that each individual carbon fiber 422 only forms one thermal connection contact point with the heat pipe 120 (e.g. note that example carbon fiber 424 forms one direct thermal connection with heat pipe 120). In contrast, in the embodiment of FIG. 4B, the heat pipe 120 is oriented to run parallel with (rather than generally perpendicular to) the individual carbon fibers 422 of the carbon fiber mat 440. such that each carbon fiber forms multiple direct thermal connections with the heat pipe 120.

Note that each of the individual carbon fibers 422 of the carbon fiber mat 420 of FIG. 4A are depicted in direct thermal and physical contact with the heat pipe 120. The phrase "direct physical contact" means a physical connection between two elements, e.g. the two elements are directly touching such that a surface of each element is touching the other element, or is only separated by an attachment device, such as an adhesive or any attachment means known to those skilled in the art. The phrase "direct thermal contact" or "direct thermal communication" means two elements share thermal (e.g. heat) energy directly between one another, the thermal energy flowing between the two elements without intermediary thermal elements facilitating or completing the thermal energy flow. In contrast, "indirect thermal contact" or "indirect thermal communication" means two elements share thermal energy flow by way of an intermediary thermal element.

With attention to the radiator fin system 401 of FIG. 4B, a carbon fiber mat 440 is shown in thermal communication with a heat pipe 120, the heat pipe 120 emitting heat 122 toward the carbon fiber mat 440. The carbon fiber mat 440 forms a radiator fin system 401. The individual carbon fibers 422 of the carbon fiber mat 440 are oriented to generally run parallel to the axis of the heat pipe 120. Stated another way, the braid pattern formed by the individual carbon fibers 422 generally runs along with or extends with the heat pipe 120. With reference to the x-y axis of FIG. 4B, the end of each carbon fiber strand 422 forming a braid with other carbon fibers 422 generally runs in the y direction and the heat pipe 120 is oriented with axial length in the same y direction. Here, the y axis is along the longitudinal length of the carbon mat and the x axis is along the lateral width of the carbon mat. In such a configuration, each carbon fiber 422 forms a direct thermal connection (if not also a physical connection) with the heat pipe 120 multiple times, such that heat 122 emitted from the heat pipe 120 flows or is received along the directions shown by the dashed arrows. Note in particular that each individual carbon fiber 422 forms more than one (i.e. forms multiple) direct thermal connection contact points with the heat pipe 120. For additional clarity, carbon fiber 423, an example individual carbon fiber 422, is depicted as a dashed line in order to illustrate the multiple (here, two) thermal (and physical) contact points of the carbon fiber 423 with the heat pipe 120. In contrast, in the embodiment of FIG. 4A, the heat pipe 120 is oriented to run generally perpendicular to (rather than generally parallel with) the individual carbon fibers 422 of the carbon fiber mat 420.

An increase in the number of thermal contact points between an individual carbon fiber and the heat pipe correlates to an increase in thermal energy transfer, thereby correlating to an increase in thermal radiation efficiency of the fin radiator formed by the carbon fiber mat formed by the individual carbon fibers. Note that a symmetrical and square-shaped carbon fiber mat (either the carbon fiber mat 420 of FIG. 4A or the carbon fibber mat 440 of FIG. 4B) would have the same number of thermal (and physical) contact points to a heat pipe 120 whether oriented with carbon fibers generally running perpendicular (FIG. 4A) or parallel (FIG. 4B) to the axis of the heat pipe 120. However, a carbon fiber mat that is not symmetrical or otherwise has more individual fiber contact points along a first side than another second side (e.g. along a longer side than a shorter side) would have more thermal (and physical) contact points along the first side; as such, to increase thermal energy transfer (and thus efficiency and effectiveness of the formed radiator fin), the first side, comprising a larger number of carbon fiber contact pints, should be oriented alongside or parallel with the heat pipe so as to increase relative thermal transfer efficiency.

Stated another way, note that the numerical difference in the amount of thermal contact points between individual carbon fibers and the heat pipe increases with the relative length of the heat pipe. Stated another way, while a fiber mat in which the braid extends lengthwise from the heat pipe may provide a candidate design for relatively short heat pipes (as depicted in FIG. 4A), as the heat pipe extends longer, it is more thermally efficient and effective to attach the longitudinal length of the fiber mat parallel to the heat pipe to give each fiber strand multiple contacts for heat transfer (as depicted in FIG. 4B).

FIGS. 5-9 depict alternate embodiments of a plurality of interconnected carbon fibers forming a carbon fiber mat. In each embodiment, the carbon fiber mat may be used to form a radiator fin which in turn may connect to a heat pipe to form a carbon fiber radiator fin system.

Generally, knit material refers to a single strand of fiber made into a series of rows and columns of interconnecting loops, thereby forming a fabric that may be stretched in any direction, regardless of the stretching properties of the constituent fiber. Any material that may be wound back over itself without degrading or breaking may be knit. The two most common stitches are knit and purl. A knit stitch looks like the back of a purl stitch, and vice-versa. These two stitches are repeated in a desired combination to form a pattern. Other stitches exist as well, but mainly function to create holes or change the shape of the fabric and will not be discussed here.

Figure 5A:
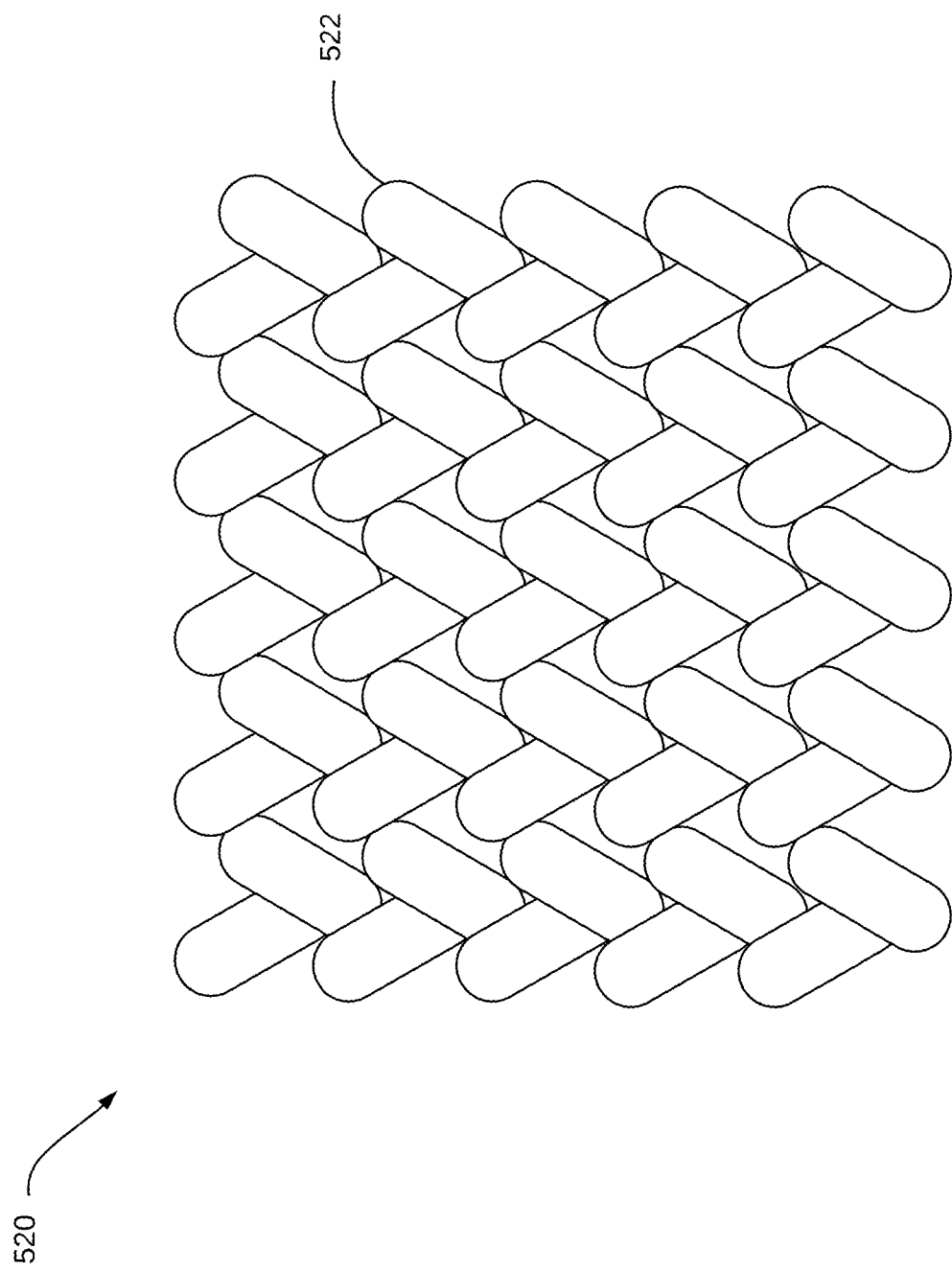
FIG. 5A is a depiction of one embodiment of interconnected carbon fibers formed in a stockinette knit stitch pattern.
Figure 5B:
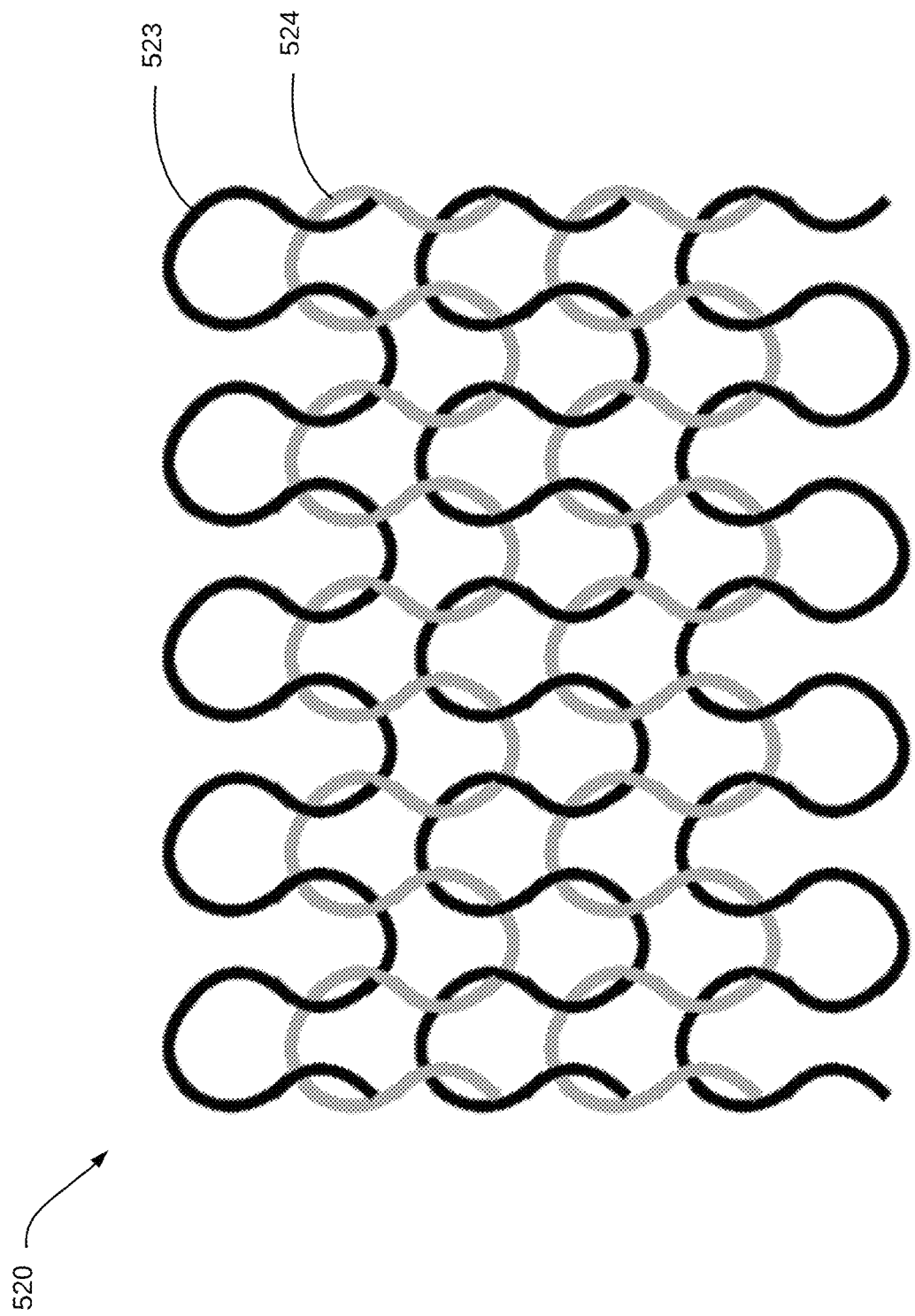
FIG. 5B is another depiction of the embodiment of interconnected carbon fibers formed in a stockinette knit stitch pattern of FIG. 5A.

With attention to FIGS. 5A-B, a set or plurality of carbon fibers are interconnected in a pattern of all knit stiches, also known as a stockinette knit stitch pattern, to form a carbon fiber mat 520. In FIG. 5A, the stockinette knit stitch pattern that forms the carbon fiber mat 520 is comprised of a set or plurality of carbon fibers 522. FIG. 5B provides another, complementary depiction of a stockinette knit stitch pattern that forms a carbon fiber mat 520 but details the interlocking rows of upper knit loops 523 and lower knit loops 524.

Figure 6A:
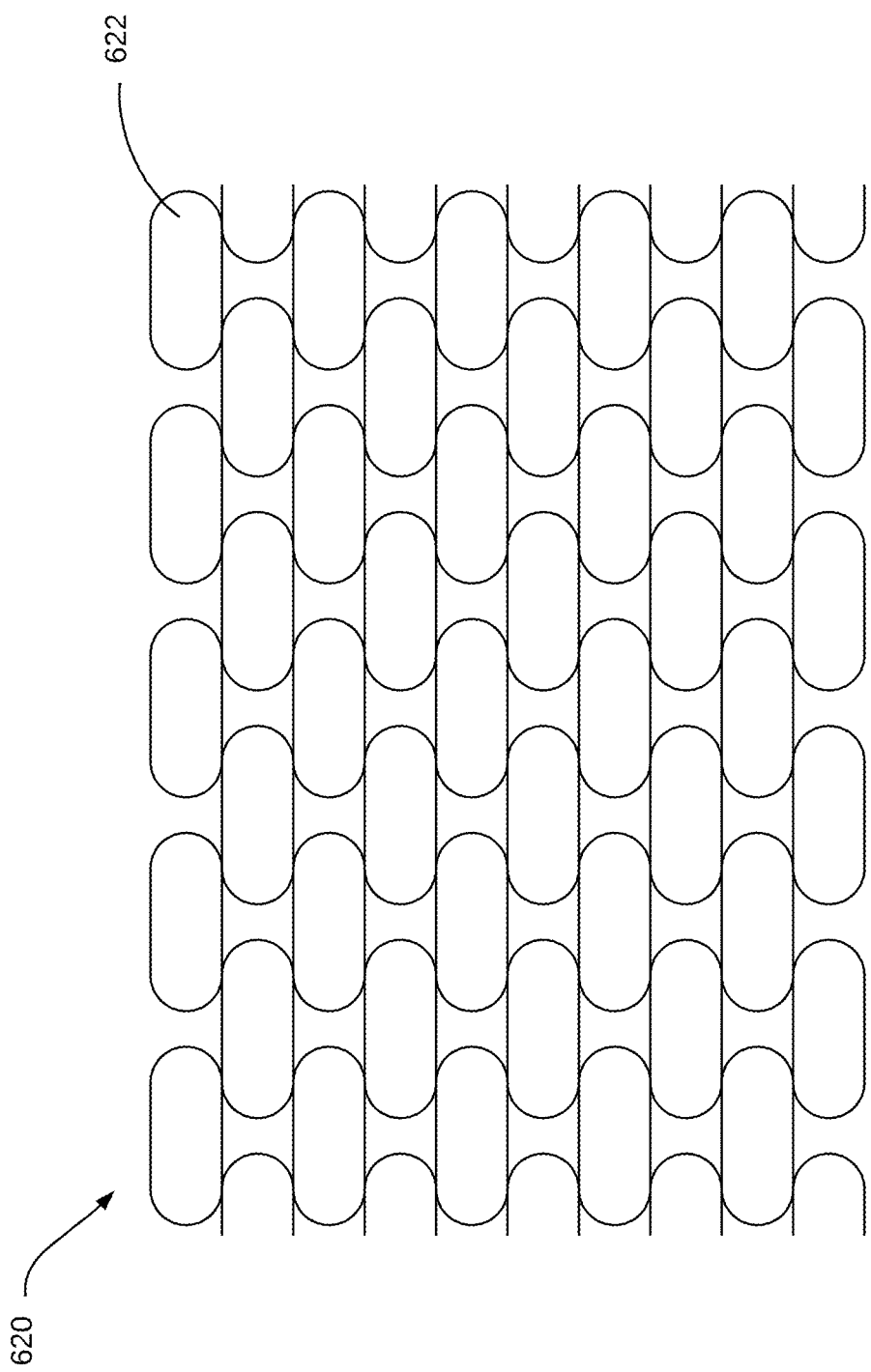
FIG. 6A is a depiction of one embodiment of interconnected carbon fibers formed in a stockinette purl stitch pattern.
Figure 6B:
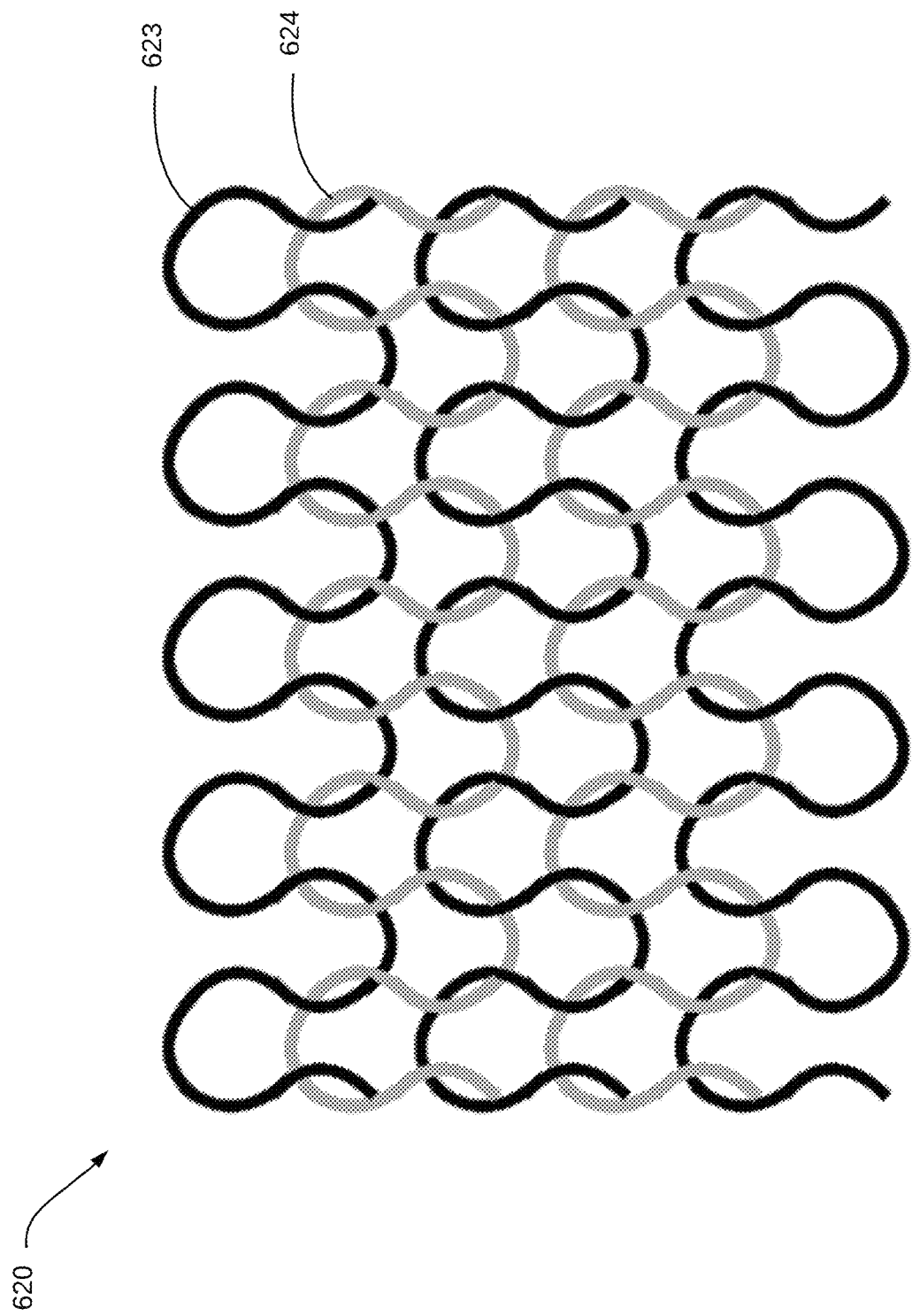
FIG. 6B is another depiction of the embodiment of interconnected carbon fibers formed in a stockinette purl stitch pattern of FIG. 6A.

With attention to FIGS. 6A-B, a set or plurality of carbon fibers are interconnected in a pattern of all purl stiches, also known as a stockinette purl stitch pattern, to form a carbon fiber mat 620. In FIG. 6A, the stockinette purl stitch pattern that forms the carbon fiber mat 620 is comprised of a set or plurality of carbon fibers 622. FIG. 6B provides another, complementary depiction of a stockinette purl stitch pattern that forms a carbon fiber mat 620 but details the interlocking rows of upper knit loops 624 and lower knit loops 623. Note that the stockinette purl stitch pattern (of FIG. 6B) is identical to the back side of the stockinette knit stitch pattern (of FIG. 5B).

The heat-rejection efficiency of carbon-fiber may be increased by creating a carbon fabric mat with an uneven, or generally not flat, surface. Stated another way, a radiator fin comprised of a carbon fiber mat with a textured, uneven, or generally not flat surface will be more efficient at radiating or dissipating heat. The term "uneven" or "textured" in regard to a carbon fiber mat means a surface that varies in thickness by more than two thicknesses of a given carbon fiber. For example, a three-dimensional braid pattern in which individual carbon fiber strands wrap around along a radial or longitudinal axis, not unlike common braids woven in human hair, would create an uneven or textured carbon fiber mat. The term "flat" in regard to a carbon fiber mat means a surface that varies in thickness by no more than two thicknesses of a given carbon fiber.

Figure 7:
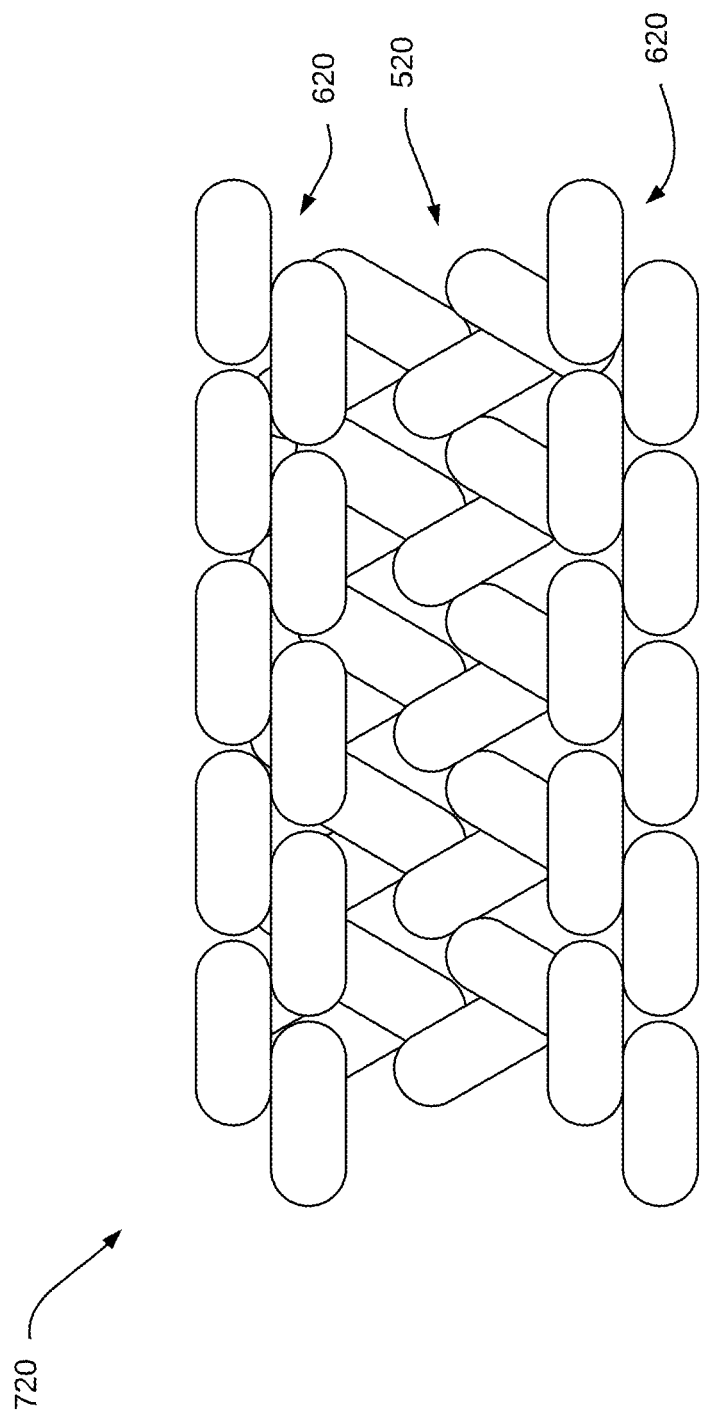
FIG. 7 is a depiction of one embodiment of interconnected carbon fibers formed in a garter stitch pattern.

With attention to FIG. 7, a set or plurality of carbon fibers are interconnected in a pattern that varies the surface texture (i.e. creates an uneven surface or a surface that is not generally flat). For example, knit and purl stitches may be combined to vary the surface texture. When placed next to each other, the flatter knit stitch withdraws below the purl stitch, thickening the resulting fabric and creating visual and tactile patterns. The most common example of this configuration is the garter stitch, where knit rows alternate with purl rows, as shown in FIG. 7. Specifically, FIG. 7 depicts a plurality of interconnected carbon fibers forming a garter stitch pattern, comprised of the stockinette purl stitch pattern that forms a carbon fiber mat 620 section (see FIG. 6B) and a stockinette knit stitch pattern that forms a carbon fiber mat 520 (see FIG. 5B). Note that a "garter stitch" generally provides rows of stitches that alternate, while a "stockinette stitch" generally provides uniform rows of stitches.

Figure 8:
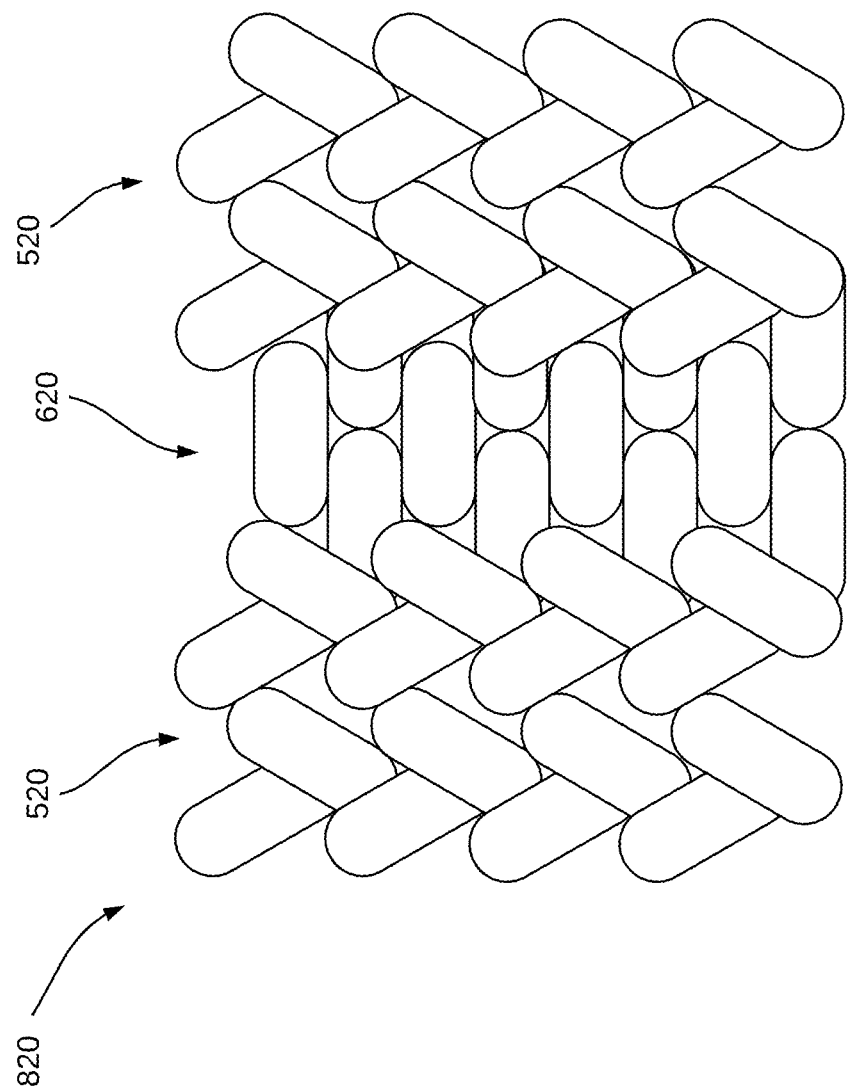
FIG. 8 is a depiction of one embodiment of interconnected carbon fibers formed in a rib stitch pattern.

With attention to FIG. 8, a set or plurality of carbon fibers are interconnected in another pattern that varies the surface texture. Alternating knit and purl stitches in the same row, but maintaining that same pattern in each row, creates a rib stitch, where the knit columns rise above the purl columns, which pull together underneath. The ribs may be of any arbitrary width. Specifically, FIG. 8 depicts a plurality of interconnected carbon fibers forming a rib stitch pattern, the pattern formed in a knit two (two carbon fiber mats 520), purl two (two carbon fiber mats 620), knit two patterns. The texture of two ribs, with space in between, is apparent in FIG. 8.

Figure 9:
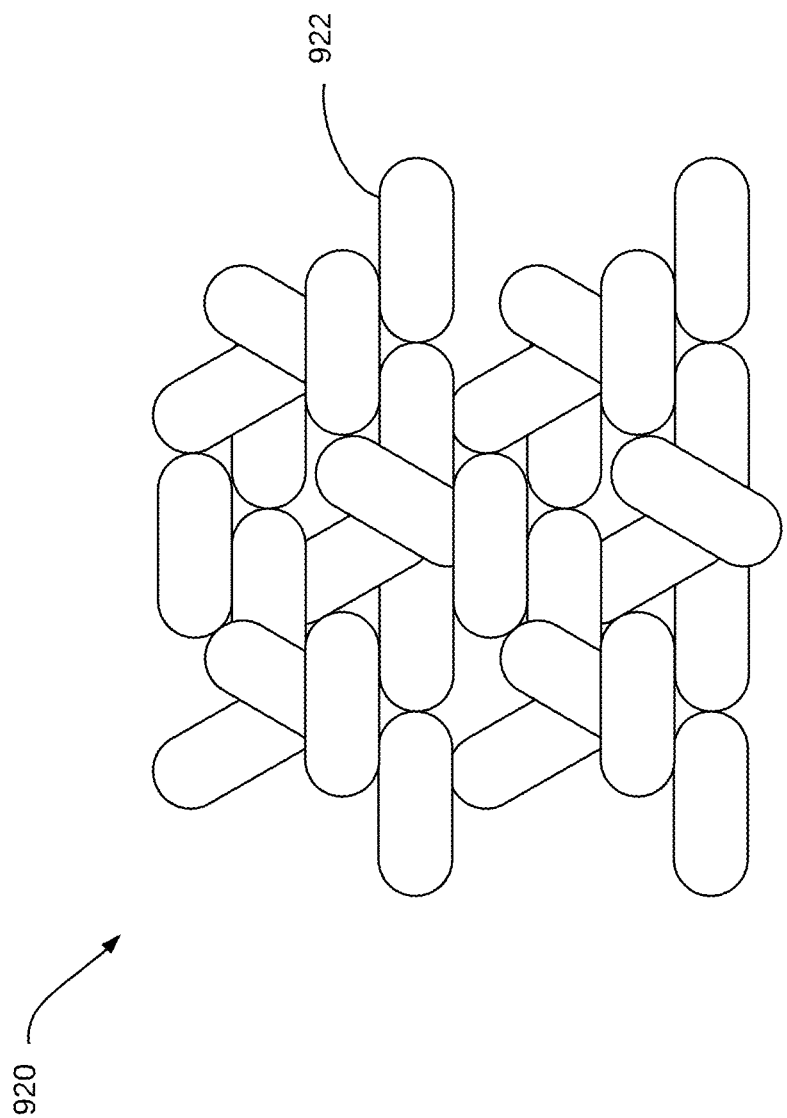
FIG. 9 is a depiction of one embodiment of interconnected carbon fibers formed in a seed stitch pattern.

With attention to FIG. 9, a set or plurality of carbon fibers are interconnected in yet another pattern that varies the surface texture. One way of maximizing the uneven texture of a knit fabric without increasing the thickness is to use a seed stitch. In this pattern, knit and purl stitches are alternated every stitch (or two) and every row (or two) in a checkerboard pattern. (note that it is possible to go larger than this, but more than one or two stitches becomes a basket weave pattern and is not as uneven at smaller scales.) Specifically, FIG. 9 depicts interconnected carbon fibers 922 formed in a seed stitch pattern to create a carbon fiber mat 920. The texture of the seed stitch pattern is formed by alternating knit and purl stitches both horizontally and vertically.

Figure 10A:
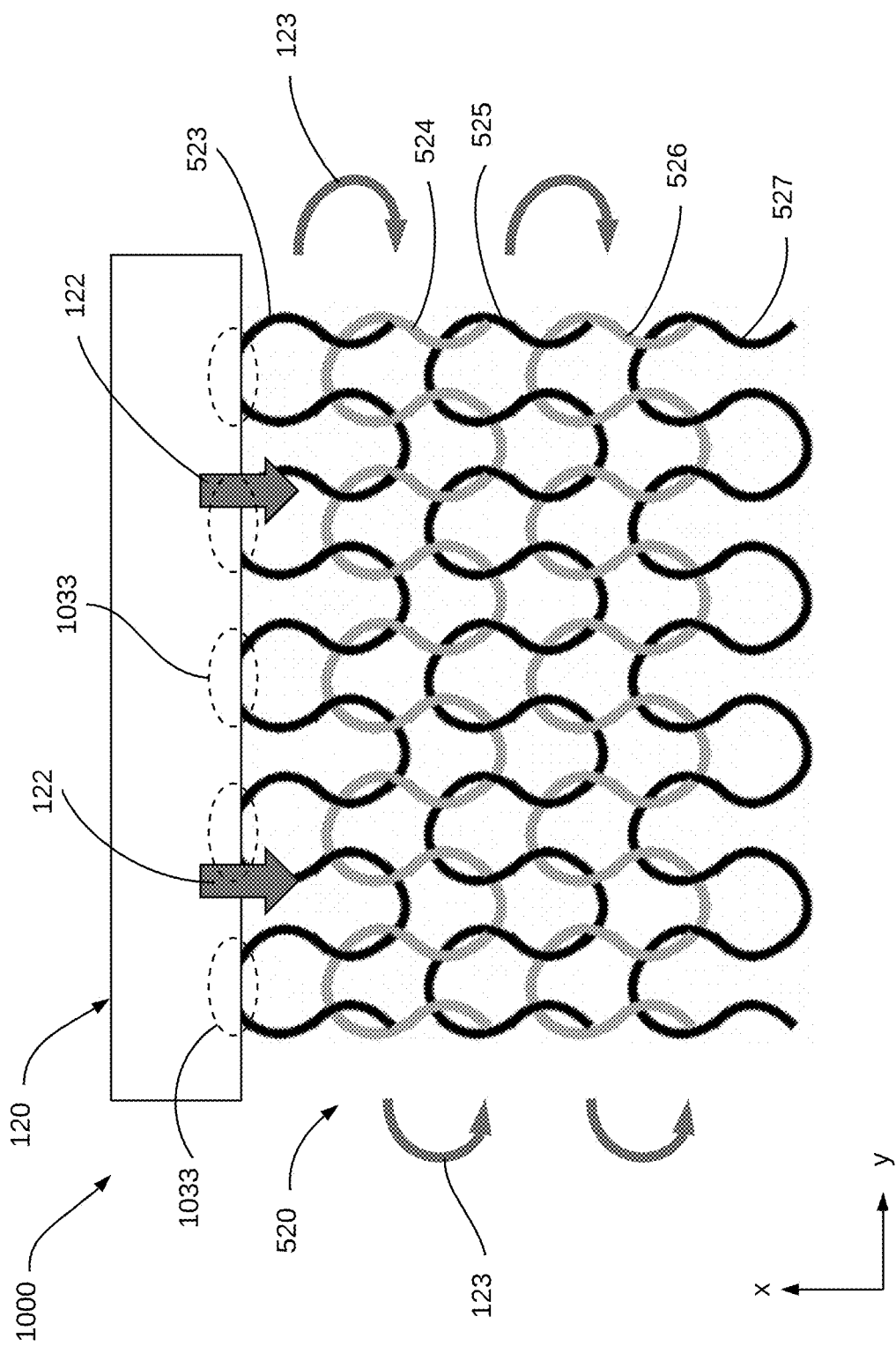
FIG. 10A is a depiction of one embodiment of a radiator fin system using the embodiment of interconnected carbon fibers formed in a stockinette knit stitch pattern of FIG. 5B.
Figure 10B:
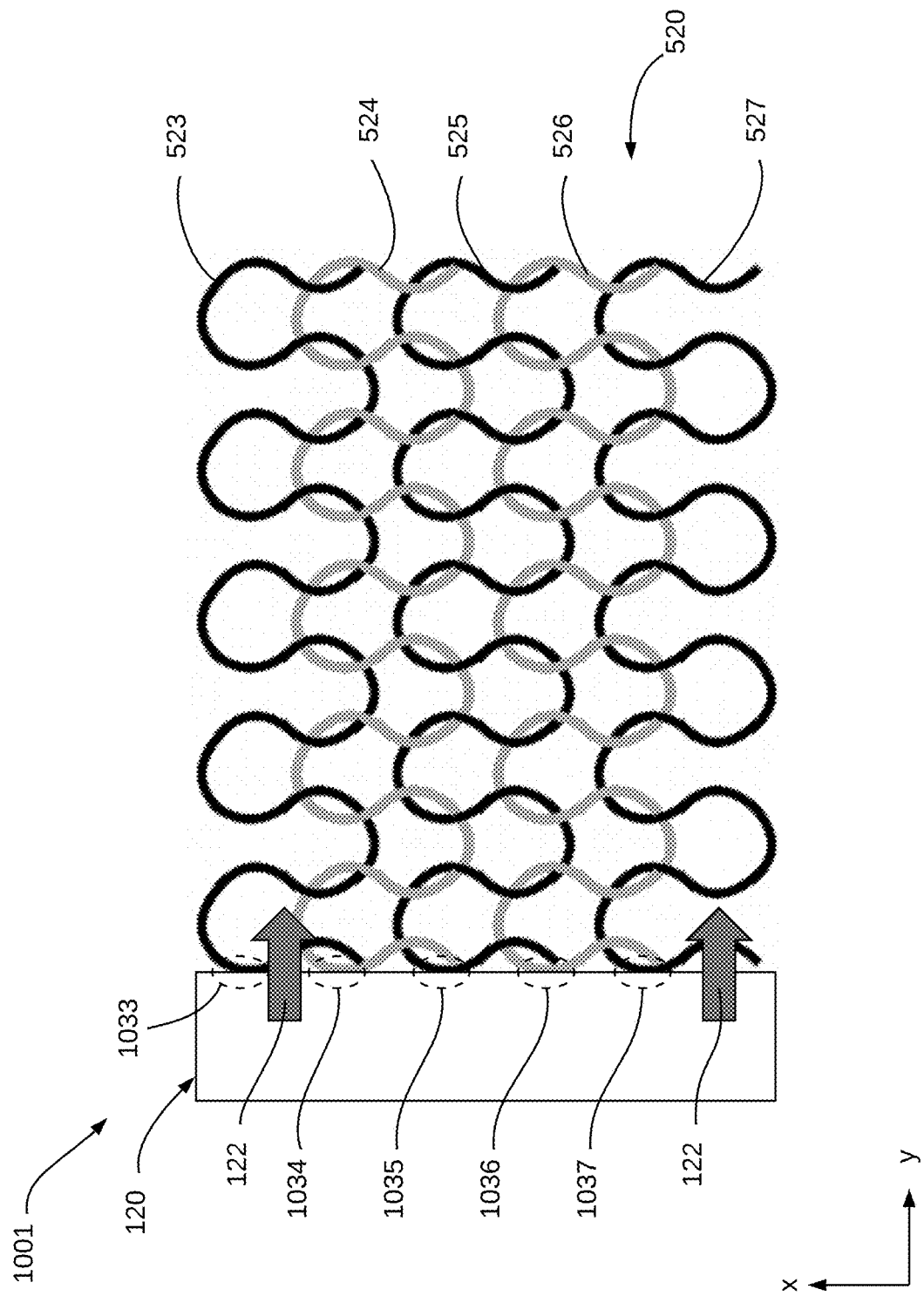
FIG. 10B is a depiction of another embodiment of a radiator fin system using the embodiment of interconnected carbon fibers formed in a stockinette knit stitch pattern of FIG. 5B.
Figure 11:
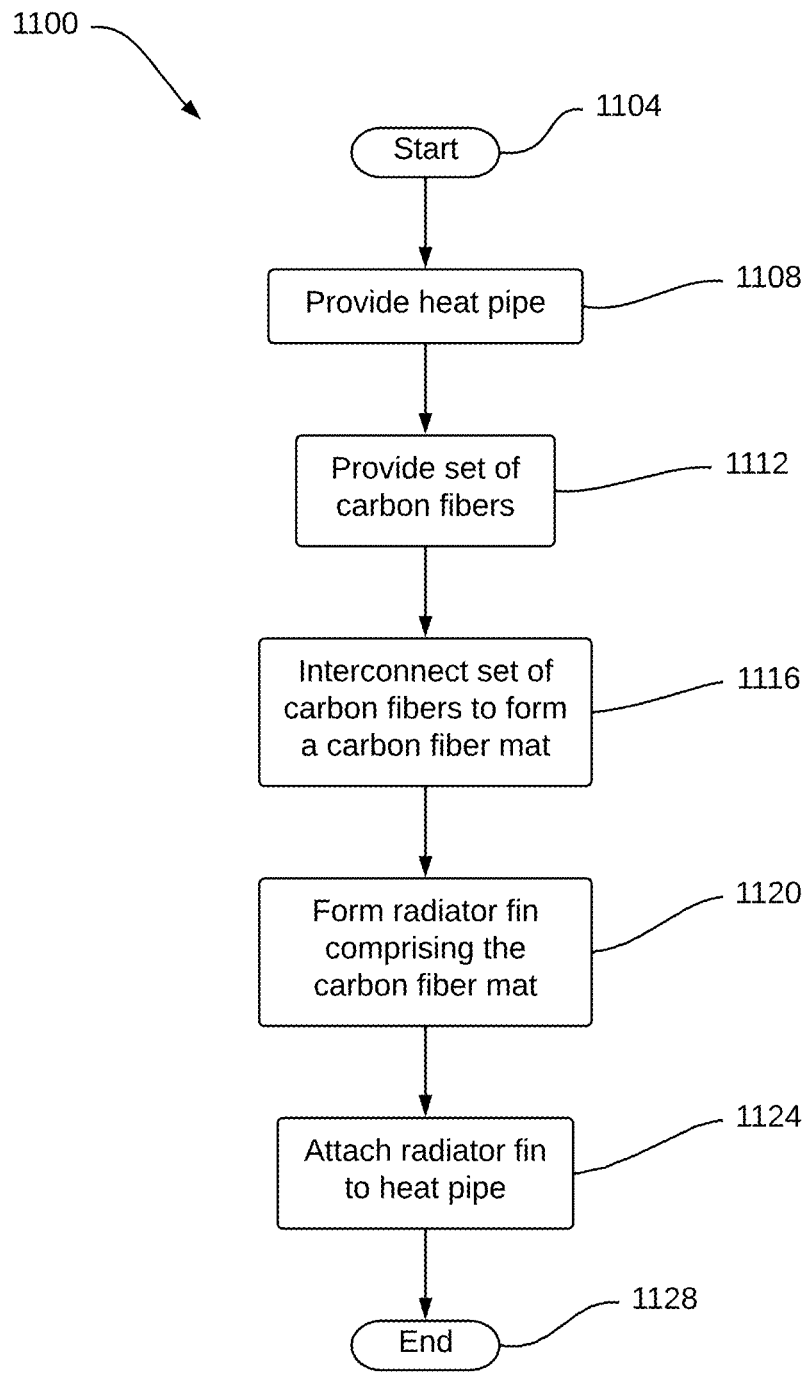
FIG. 11 is flowchart of a method of assembling a radiator fin system.

FIGS. 10A-B and 11 describe details and features of forming a radiator fin system comprising a carbon fiber mat, formed from interconnected carbon fibers, and a heat pipe. The relative orientation of the carbon fibers that form the carbon fiber mat relative to the heat pipe, and specifically the relative orientation of the carbon fibers relative to the dominant direction of heat flow from the heat pipe, influences the efficiency of heat diffusion by the radiator fin system. Generally, as discussed above with respect to FIGS. 4A-B, an increase in contact points between the carbon fibers and the heat pipe causes an increase in thermal dissipation efficiency, meaning more heat will be discharged by the radiator fin system.

FIGS. 10A-B depict two embodiments of a radiator fin system, each comprising a radiator fin comprising the carbon fiber mat 520 of FIG. 5B. Specifically, the carbon fiber mat 520 is formed from a plurality of interconnected and interlocking rows of knit loops 523, 524, 525, 526, 527 which create a stockinette knit stitch pattern.

FIG. 10A and FIG. 10B differ in the orientation of the carbon fibers, which form the carbon fiber mat 520, relative to the heat pipe 120. As discussed above, an increase in contact points between the carbon fibers and the heat pipe causes an increase in thermal dissipation efficiency, meaning more heat will be discharged by the radiator fin system. Given the characteristics of the stitch pattern of the carbon fiber mat 520 (a stockinette knit stitch pattern), it is more thermally efficient to attach the carbon fiber mat 520 along the x (lateral) axis of the carbon fiber mat 520, as shown in FIG. 10B, rather than along the y (longitudinal) axis of the carbon fiber mat 520, as shown in FIG. 10A, as described below. More specifically, the configuration of FIG. 10B provides thermal contact points at several places in regular intervals along the carbon fiber, whereas the configuration of FIG. 10A only provides contact points to one small section of the carbon fiber.

With attention to FIG. 10A, because heat transfer principally occurs along the length of each carbon fiber, rather than between adjacent fibers, the configuration of FIG. 10A is relatively inefficient because the fabric is made up of one continuous strand. Also, this configuration provides a pathway to radiator fin failure if one of the fibers is severed, as such a failure would reduce the heat rejecting area to only that before the break. Furthermore, there is only one section of fiber (the carbon fiber 523 of FIG. 10A) where heat 122 may be transferred from the heat pipe 120, which could be limiting, since once that section reaches the same temperature as the outer surface of the heat pipe 120, no more heat 122 will flow.

In the configuration of FIG. 10A, upper fiber 523 makes thermal and physical contact with heat pipe 120 at each of upper fiber contact areas 1033. At each of upper fiber contact areas 1033, heat 122 output from heat pipe 120 is received by carbon fiber 523. The heat received by carbon fiber 523 is transferred to adjacent fiber 524, which in turn transfers heat 122 to adjacent carbon fiber 524, etc., as depicted by the curved heat flow arrows 123.

The configuration of FIG. 10A provides thermal contact points to only one carbon fiber: carbon fiber 523. The carbon fiber mat 520 is oriented, relative to the heat pipe 120, such that the individual carbon fibers of the carbon fiber mat 520 are oriented to generally run or extend parallel to the axis of the heat pipe 120. Stated another way, the stockinette knit stitch pattern formed by the individual carbon fibers generally runs with the heat pipe 120. With reference to the x-y axis of FIG. 10A, the length of each carbon fiber strand generally runs or extends in the y direction and the heat pipe 120 is oriented with axial length in the (same) y direction. Here, the y axis is along the lateral width of the carbon mat and the x axis is along the longitudinal length of the carbon mat. In such a configuration, only the carbon fiber 523 forms thermal connections 1033 with the heat pipe 120. In contrast, in the embodiment of FIG. 10B, the heat pipe 120 is oriented to run or extend perpendicular with (rather than generally parallel to) the individual carbon fibers of the carbon fiber mat 520.

With attention to FIG. 10B, a carbon fiber mat 520 is shown in thermal communication with a heat pipe 120, the heat pipe 120 emitting heat 122 toward the carbon fiber mat 520. The individual carbon fibers 523, 524, 525, 526, 527 of the carbon fiber mat 520 are oriented to generally run or extend perpendicular to the axis of the heat pipe 120. Stated another way, the pattern formed by the individual carbon fibers generally runs away from the heat pipe 120. With reference to the x-y axis of FIG. 10B, the length of each carbon fiber strand 523, 524, 525, 526, 527 generally runs in the y direction and the heat pipe 120 is oriented with axial length in the perpendicular x direction. Here, the y axis is along the lateral width of the carbon mat and the x axis is along the longitudinal length of the carbon mat. In such a configuration, each carbon fiber forms a thermal connection (if not also a physical connection) with the heat pipe 120. Specifically, carbon fiber 523 forms a thermal contact 1033 with heat pipe 120, carbon fiber 524 forms a thermal contact 1034 with heat pipe 120, carbon fiber 525 forms a thermal contact 1035 with heat pipe 120, carbon fiber 526 forms a thermal contact 1036 with heat pipe 120, and carbon fiber 527 forms a thermal contact 1037 with heat pipe 120.

It is noted that, in the configuration of FIG. 10B, if one carbon fiber is severed, only that row is lost; the rest would remain unaffected, resulting in a relatively more robust design than the configuration of FIG. 10A.

In comparing the configurations of FIG. 10A with 10B, the configuration of FIG. 10B provides thermal contact points to several carbon fibers, whereas the configuration of FIG. 10A only provides thermal contact points to one carbon fiber. Thus, the configuration of FIG. 10B will be more thermally efficient and effective as a component of a radiator fin system, because an increase in the number of thermal contact points between individual carbon fibers and a heat pipe correlates to an increase in thermal energy transfer, thereby correlating to an increase in thermal radiation efficiency of the fin radiator formed by a carbon fiber mat formed by the individual carbon fibers.

FIG. 11 describes a method 1100 of assembling a radiator fin system. The method 1100 utilizes the elements, configurations, and embodiments described above in FIGS. 1-10. Reference will be made to element numbers provided on FIGS. 1-10.

The method 1100 starts at step 1104 and ends at step 1128. Any of the steps, functions, and operations discussed herein can be performed continuously and automatically. In some embodiments, one or more of the steps of the method 1100 may comprise computer control, use of computer processors, and/or some level of automation. The steps are notionally followed in increasing numerical sequence, although, in some embodiments, some steps may be omitted, some steps added, and the steps may follow other than increasing numerical order.

After starting at step 1104, a heat pipe 120 is provided at step 1108. The heat pipe 120 is in thermal communication with a thermal energy source 10. In one embodiment, a plurality of heat pipes 120 are provided. In one embodiment, the heat pipe is a cylindrical pipe forming an internal cavity or aperture. Other configurations of heat pipe 120 are possible, as known to those skilled in the art. After step 1108, the method 1100 continues to step 1112.

At step 1112, a plurality or set of carbon fibers is provided. In one embodiment, the plurality of carbon fibers is similar or identical. In some embodiments, the plurality of carbon fibers is not the same, and may vary in any of several forms or features, to include size, elasticity, thermal conduction, and the like. In some embodiments, some or all of the carbon fibers are not carbon fibers but instead are any material that may be formed into the type of patterns described above. After step 1112, the method 1100 continues to step 1116.

At step 1116, the plurality of carbon fibers is interconnected to form a carbon fiber mat. The plurality of carbon fibers is interconnected in any of the ways described above, e.g. to form a braid pattern, a stockinette knit stitch pattern, etc. The set or plurality of fibers may form a generally flat carbon fiber mat or a generally textured carbon fiber mat. After step 1116, the method 1100 continues to step 1120.

At step 1120, a radiator fin 110 is formed from the carbon fiber mat of step 1116. The radiator fin comprises the carbon fiber mat formed in step 1116 and may, in some embodiments, comprise more than one carbon fiber mat (see, e.g., FIG. 13). In some embodiments, the radiator fin may comprise components or elements in addition to one or more carbon fiber mats (see, e.g., FIG. 12). After step 1120, the method 1100 continues to step 1124.

At step 1124, the radiator fin is attached to one or more heat pipes. The radiator fin, comprising one or more carbon fiber mats, may be oriented in any of the ways described above. In particular, the one or more carbon mats may be oriented with attention to the direction of the running length of the carbon fibers that form a particular carbon mat, and/or the type of interconnected pattern formed from the set or plurality of carbon fibers, as described, for example, with regards to FIGS. 4A-B. The radiator fin may be attached to the heat pipe in any manner know to those skilled in the art, to include by electron beam welding, and in any of several relative orientations, to include a radiator fin encircling the heat pipe, for example. After step 1124, the method 1100 ends at step 1128.

It is noted that selecting between braiding and knitting methods for creating a radiator fin fabric out of a conductive material such as carbon-fiber depends on the properties of the fiber itself, as well as the properties of the resulting fabric. Braiding requires very little flexibility on the part of the fiber strands, while knitting requires the fiber to bend enough to form interlocking loops. Because heat rejection per unit area is a quantity to be maximized, the weave or knit needs to be tight. Therefore, a fiber with a large bend radius can only be braided. Likewise, a fiber with a small bend radius could be either braided or knit.

Also, the thickness of the radiator fin depends on the thickness of the fiber strand as well as the method of turning the fiber stands into fabric. The thinnest fin possible is a flat braid, with a maximum height being that of two strands crossing each other. Thicker braids are possible, through the use of complex, three-dimensional weaving patterns. Knitting patterns can be found in a range of thicknesses while maintaining simplicity of processing.

Furthermore, some methods of processing (of carbon fibers) result in built-in stresses in the resulting material. If the fiber is twisted into yarn before being woven or knitted, built-in stress result which make the fiber easier to work. Braided methods tend not to result in much built-in stress, though with some patterns, there can be a natural twist that forms. This is less likely with simple, flat braids. Various knitted patterns have a variety of built-in stress patterns. The most common built-in stress pattern results in curl in at the edges of a stockinette stitched fabric. Garter stitched fabric also tends to curl at the corners, but not as much as stockinette. The textile industry has methods of reducing built-in stresses, which may be applied in working with carbon fibers. Lastly, seed stitched fabric has very little built-in stress and tends to lie very flat. On the other end, rib knit fabric has so much built-in stress that it contracts the fabric into the distinctive ribbed pattern, resulting in more fabric per unit area.

As to deformability, all woven and knit fabrics can be deformed with very little force in preferred directions. Unless the constituent fibers are stretchable, woven fabrics can only be stretched in two directions: halfway between the warp and weft strands. Knit fabrics, in contrast, may be easily stretched or deformed in any direction. The stitch pattern only determines how much it can stretch and how likely it is to return to its original shape when the external force is removed.

As to unraveling, any fabric, when damaged, is capable of unraveling, and may take any of a number of forms. For example, an edge can fray and begin to unweave. A knit can get a run, where a single column of stitches is undone, but doesn't necessarily spread to adjacent stitches. The likelihood of this becoming a problem is heavily dependent on the properties of the fiber being used. The orientation of the fin's attachment to the heat pipe will affect how much of heat radiating capability is lost when a strand is severed. Elements may be added to a carbon fiber mat to mitigate if not prevent unraveling, such as that provided below with respect to FIG. 12.

Figure 12:
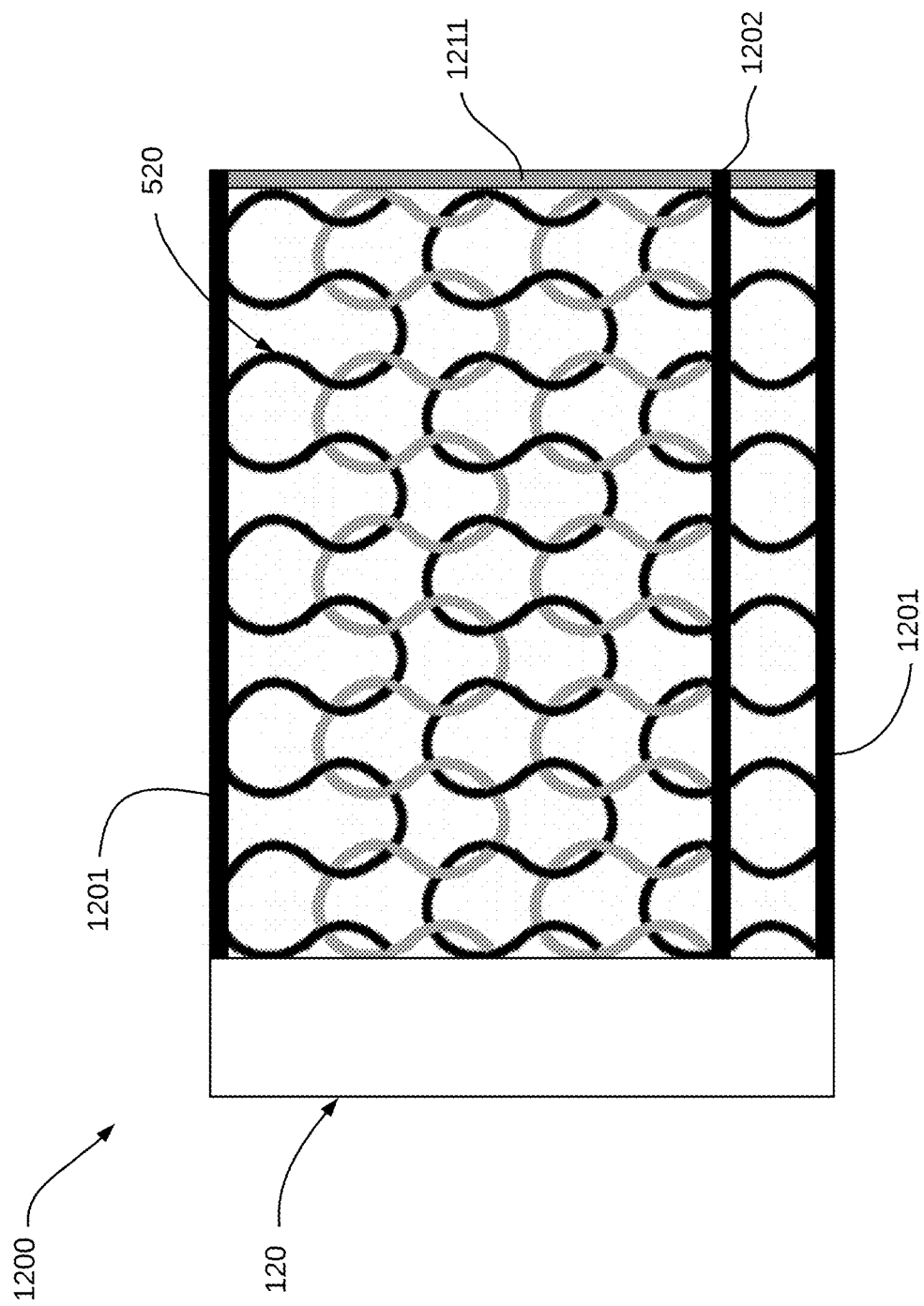
FIG. 12 is a depiction of another embodiment of a radiator fin system in an operational environment.

FIG. 12 is a depiction of another embodiment of a radiator fin system 1200 with heat pipe 120. The radiator fin system 1200 is similar to that of FIG. 10B, with the addition of several members which provide structural support and/or enhance thermal energy transfer.

A pair of end stringers 1201 are fitted to the carbon fiber mat 520 at each side of the carbon fiber mat 520. The end stringers 1201 provide additional structural support to the carbon fiber mat 520 and may mitigate or prevent deformation of the carbon fiber mat. Furthermore, if the end stringers 1201 are made of a conductive material (e.g. a metal), the end stringer 1201 may enhance the thermal efficiency of the resulting radiator fin system by providing an additional transfer route for thermal energy and provide additional communication points between the plurality of carbon fibers forming the carbon fiber mat.

An inner stringer 1202 and an end rib 1211 similarly provide additional structural support and/or thermal communication between the carbon fiber mat 520 and the heat pipe 120. The end rib 1211 may also mitigate or prevent unraveling of the carbon fiber mat. The end rib connects with inner stringer 1202 and both end stringers 1201. Other combinations or configurations of inner stringers 1202, end stringers 1201, and/or end ribs 1211 are possible, such as diagonally positioned inner or end stringers, formation of checkboard patterns to create compartmentalized rectangular zones, etc.

Figure 13:
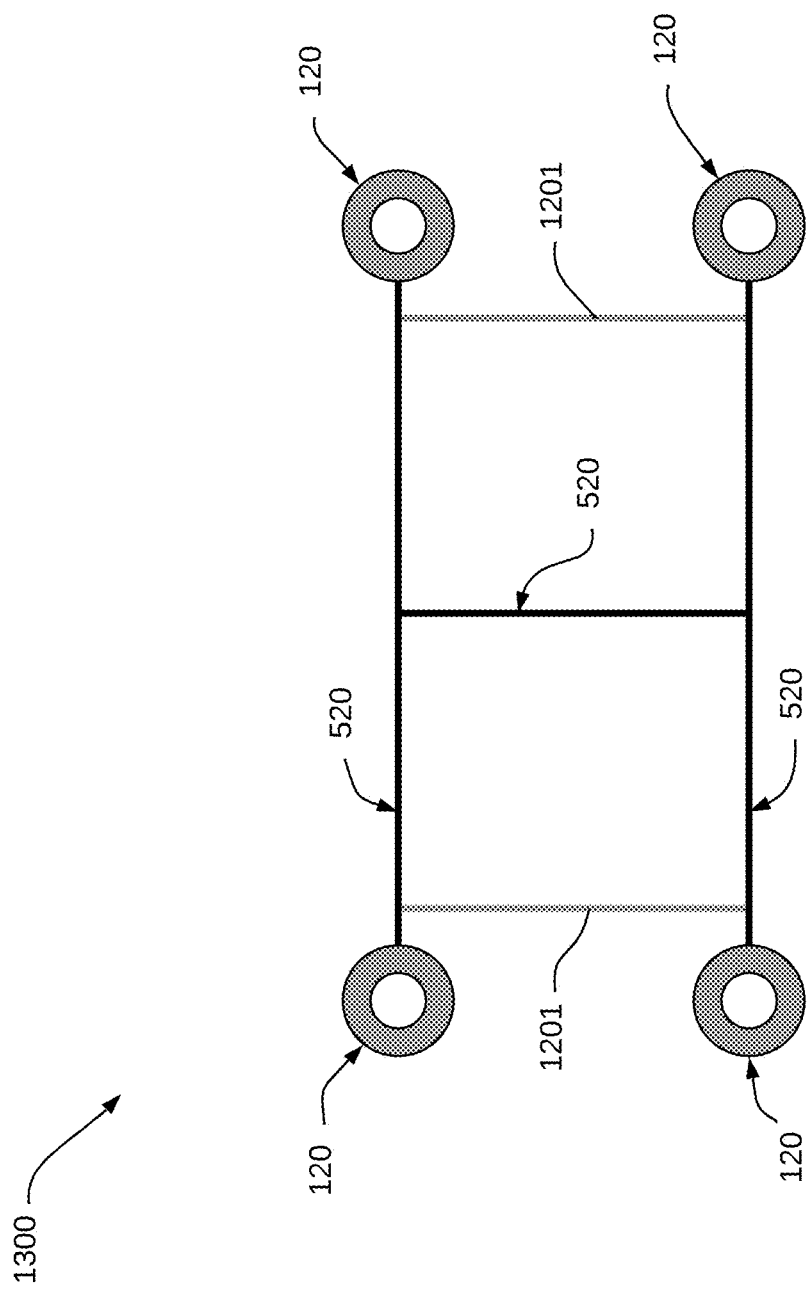
FIG. 13 is a depiction of another embodiment of a radiator fin system in an operational environment.

FIG. 13 is a depiction of another embodiment of a radiator fin system 1300 comprising multiple heat pipes 120 arranged in an array of heat pipes 120. FIG. 13 is an end view of a stacked radiator fin system 1300 comprising three carbon fiber mats 520, four heat pipes 120, and two end stringers 1201. An upper carbon fiber mat 520 connects an upper pair of heat pipes 120, and a lower carbon fiber mat 520 connects a lower pair of heat pipes 120. A third carbon fiber mat 520 connects the upper carbon fiber mat 520 and the lower carbon fiber mat. A first end stringer 1201 connects a first pair of heat pipes 120. A second end stringer 1201 connects a second pair of heat pipes 120. Other combinations or configurations of carbon fiber mats, heat pipes, and stringer or rib members are possible.

The exemplary systems and methods of this disclosure have been described in relation to systems and methods of manufacture of carbon fiber radiator fins, such as carbon fiber radiator fins for space applications. However, to avoid unnecessarily obscuring the present disclosure, the preceding description omits a number of known structures and devices, and other application and embodiments. This omission is not to be construed as a limitation of the scopes of the claims. Specific details are set forth to provide an understanding of the present disclosure. It should however be appreciated that the present disclosure may be practiced in a variety of ways beyond the specific detail set forth herein.

Furthermore, it should be appreciated that the various links connecting the elements can be wired or wireless links, or any combination thereof, or any other known or later developed element(s) that is capable of supplying and/or communicating data to and from the connected elements. These wired or wireless links can also be secure links and may be capable of communicating encrypted information. Transmission media used as links, for example, can be any suitable carrier for electrical signals, including coaxial cables, copper wire and fiber optics, and may take the form of acoustic or light waves, such as those generated during radio-wave and infra-red data communications.

Also, while the methods have been discussed and illustrated in relation to a particular sequence of events, it should be appreciated that changes, additions, and omissions to this sequence can occur without materially affecting the operation of the disclosed embodiments, configuration, and aspects.

A number of variations and modifications of the disclosure can be used. It would be possible to provide for some features of the disclosure without providing others.

Although the present disclosure describes components and functions implemented in the aspects, embodiments, and/or configurations with reference to particular standards and protocols, the aspects, embodiments, and/or configurations are not limited to such standards and protocols. Other similar standards and protocols not mentioned herein are in existence and are considered to be included in the present disclosure. Moreover, the standards and protocols mentioned herein and other similar standards and protocols not mentioned herein are periodically superseded by faster or more effective equivalents having essentially the same functions. Such replacement standards and protocols having the same functions are considered equivalents included in the present disclosure.

The present disclosure, in various aspects, embodiments, and/or configurations, includes components, methods, processes, systems and/or apparatus substantially as depicted and described herein, including various aspects, embodiments, configurations embodiments, sub-combinations, and/or subsets thereof. Those of skill in the art will understand how to make and use the disclosed aspects, embodiments, and/or configurations after understanding the present disclosure. The present disclosure, in various aspects, embodiments, and/or configurations, includes providing devices and processes in the absence of items not depicted and/or described herein or in various aspects, embodiments, and/or configurations hereof, including in the absence of such items as may have been used in previous devices or processes, e.g., for improving performance, achieving ease and\or reducing cost of implementation.

The foregoing discussion has been presented for purposes of illustration and description. The foregoing is not intended to limit the disclosure to the form or forms disclosed herein. In the foregoing Detailed Description for example, various features of the disclosure are grouped together in one or more aspects, embodiments, and/or configurations for the purpose of streamlining the disclosure. The features of the aspects, embodiments, and/or configurations of the disclosure may be combined in alternate aspects, embodiments, and/or configurations other than those discussed above. This method of disclosure is not to be interpreted as reflecting an intention that the claims require more features than are expressly recited in each claim. Rather, as the following claims reflect, inventive aspects lie in less than all features of a single foregoing disclosed aspect, embodiment, and/or configuration. Thus, the following claims are hereby incorporated into this Detailed Description, with each claim standing on its own as a separate preferred embodiment of the disclosure.

Moreover, though the description has included description of one or more aspects, embodiments, and/or configurations and certain variations and modifications, other variations, combinations, and modifications are within the scope of the disclosure, e.g., as may be within the skill and knowledge of those in the art, after understanding the present disclosure. It is intended to obtain rights which include alternative aspects, embodiments, and/or configurations to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

What is claimed is:

1. A method of manufacturing a carbon fiber radiator fin system, the method comprising:
   providing a set of carbon fibers configured to bend at least along a longitudinal axis;
   interlacing the set of carbon fibers to form a radiator fin, the radiator fin formed from the set of carbon fibers;
   wherein the radiator fin is devoid of weft tows in the subset of carbon fibers; and
   attaching the radiator fin to a heat pipe, the heat pipe in thermal communication with a thermal energy source;
   wherein:

substantially each carbon fiber of the set of carbon fibers is coupled to the heat pipe; and the radiator fin conducts thermal energy away from the heat pipe.

2. The method of claim 1, wherein the surface of the radiator fin is a textured surface.

3. The method of claim 1, wherein the interlaced pattern is at least one of a braided pattern and a knit stitch pattern.

4. The method of claim 1, wherein the attaching the radiator fin to a heat pipe step is performed by electron beam welding.

5. The method of claim 1, wherein the interlaced pattern is a knit stitch interlaced pattern which defines a carbon fiber mat with a longitudinal axis extending with an axial length of the set of carbon fibers, the heat pipe substantially parallel with the carbon fiber mat longitudinal axis.

6. The method of claim 5, wherein heat pipe is coupled to each carbon fiber at multiple locations along a respective longitudinal axis of each carbon fiber.

7. The method of claim 1, wherein the surface of the radiator fin is a textured surface and the interlaced pattern is a knit stitch interlaced pattern.

8. A carbon fiber radiator fin system comprising:

a set of carbon fibers configured to bend at least along a longitudinal axis, each carbon fiber configured to conduct thermal energy when in thermal communication with a heat pipe for conducting thermal energy away from the heat pipe, wherein the set of carbon fibers form an interlaced pattern to define a radiator fin, the radiator fin being in thermal communication with the heat pipe, wherein at least one carbon fiber of the set of carbon fibers is in direct thermal contact with the heat pipe at more than one location along a respective longitudinal axis of each carbon fiber;

wherein the interlaced pattern includes one of a braided pattern; and wherein the braided interlaced pattern is devoid of weft tows.

9. The carbon fiber radiator fin system of claim 8, therein the interlaced pattern includes at least one of a flat braid, a three-dimensional braid.

10. The carbon fiber radiator fin system of claim 8, wherein the thermal energy source is a nuclear-electric propulsion system.

11. The carbon fiber radiator fin system of claim 8, wherein the interlaced pattern defines a carbon fiber mat with a longitudinal axis extending with an axial length of the set of carbon fibers, the heat pipe substantially parallel with the carbon fiber mat longitudinal axis.

12. The carbon fiber radiator fin system of claim 8, wherein at least a portion of the radiator fin at least partially encircles the heat pipe.

* * * * *